(12) United States Patent
Cho et al.

(10) Patent No.: US 11,805,685 B2
(45) Date of Patent: Oct. 31, 2023

(54) ELECTRONIC DEVICE INCLUDING CONDUCTIVE ADHESIVE LAYER

(71) Applicant: Samsung Display Co., Ltd., Yongin-si (KR)

(72) Inventors: Youngmin Cho, Seongnam-si (KR); Hongam Kim, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 259 days.

(21) Appl. No.: 17/205,419

(22) Filed: Mar. 18, 2021

(65) Prior Publication Data

US 2022/0037446 A1 Feb. 3, 2022

(30) Foreign Application Priority Data

Jul. 30, 2020 (KR) .................. 10-2020-0095490

(51) Int. Cl.
*H10K 59/131* (2023.01)
*H01L 23/00* (2006.01)

(52) U.S. Cl.
CPC ............ *H10K 59/131* (2023.02); *H01L 24/06* (2013.01); *H01L 24/14* (2013.01); *H01L 24/16* (2013.01);
(Continued)

(58) Field of Classification Search
CPC ..... H01L 27/3276; H01L 24/06; H01L 24/14; H01L 24/16; H01L 24/29; H01L 24/32; H01L 24/73; H01L 2224/0603; H01L 2224/06132; H01L 2224/06135; H01L 2224/1403; H01L 2224/16145; H01L 2224/16502; H01L 2224/29198; H01L 2224/32145; H01L 2224/73204; H01L 2224/16225; H01L 2224/29298;
(Continued)

(56) References Cited

U.S. PATENT DOCUMENTS 5,461,261 A * 10/1995 Nishiguchi ............ H01L 24/11
257/781
9,960,138 B2 5/2018 Saruyama et al.
10,065,380 B2 9/2018 Muramoto et al.
10,068,929 B2 9/2018 Min et al.
10,121,756 B2 11/2018 Shinohara et al.
10,354,967 B2 7/2019 Kim et al.
(Continued)

FOREIGN PATENT DOCUMENTS

JP            6324746       5/2018
KR        10-0746330        8/2007
KR     10-2018-0035468      4/2018
(Continued)

*Primary Examiner* — Nduka E Ojeh
*Assistant Examiner* — Laura M Dykes
(74) *Attorney, Agent, or Firm* — KILE PARK REED & HOUTTEMAN PLLC

(57) ABSTRACT

The present application relates to an electronic device. The electronic device includes a first electronic component and a second electronic component. The first electronic component includes a first pad area including first pads and second pads spaced apart from the first pads. A number of the first pads is greater than a number of the second pads. The second electronic component includes first bumps electrically connected to the first pads, and second bumps electrically connected to the second pads. Each of the second bumps has a bonding area greater than a bonding area of each of the first bumps. A conductive adhesive layer is disposed between the first electronic component and the second electronic component to electrically connect the first pads to the first bumps.

20 Claims, 17 Drawing Sheets

(52) U.S. Cl.
CPC .............. *H01L 24/29* (2013.01); *H01L 24/32* (2013.01); *H01L 24/73* (2013.01); *H01L 2224/0603* (2013.01); *H01L 2224/06132* (2013.01); *H01L 2224/06135* (2013.01); *H01L 2224/1403* (2013.01); *H01L 2224/16145* (2013.01); *H01L 2224/16502* (2013.01); *H01L 2224/29198* (2013.01); *H01L 2224/32145* (2013.01); *H01L 2224/73204* (2013.01)

(58) Field of Classification Search
CPC ...... H01L 2224/32225; H01L 27/3253; H05K 1/181; H05K 1/111; H05K 3/321; H05K 3/4007; H05K 2201/10128; H05K 2203/0285; G02F 1/13458
USPC .......................................................... 257/738
See application file for complete search history.

(56) References Cited

U.S. PATENT DOCUMENTS

| | | | |
|---|---|---|---|
| 2013/0228916 A1* | 9/2013 | Mawatari | H01L 24/14 257/737 |
| 2015/0098035 A1* | 4/2015 | Saitou | G02F 1/13452 349/33 |
| 2017/0176804 A1* | 6/2017 | Choi | H05K 1/113 |
| 2017/0256583 A1* | 9/2017 | Choi | G02F 1/13452 |
| 2017/0352636 A1 | 12/2017 | Akutsu | |
| 2017/0364726 A1 | 12/2017 | Buchan et al. | |
| 2020/0051940 A1* | 2/2020 | Kim | G02F 1/13454 |

FOREIGN PATENT DOCUMENTS

| | | |
|---|---|---|
| KR | 10-2019-0019074 | 2/2019 |
| KR | 10-1951939 | 2/2019 |

* cited by examiner

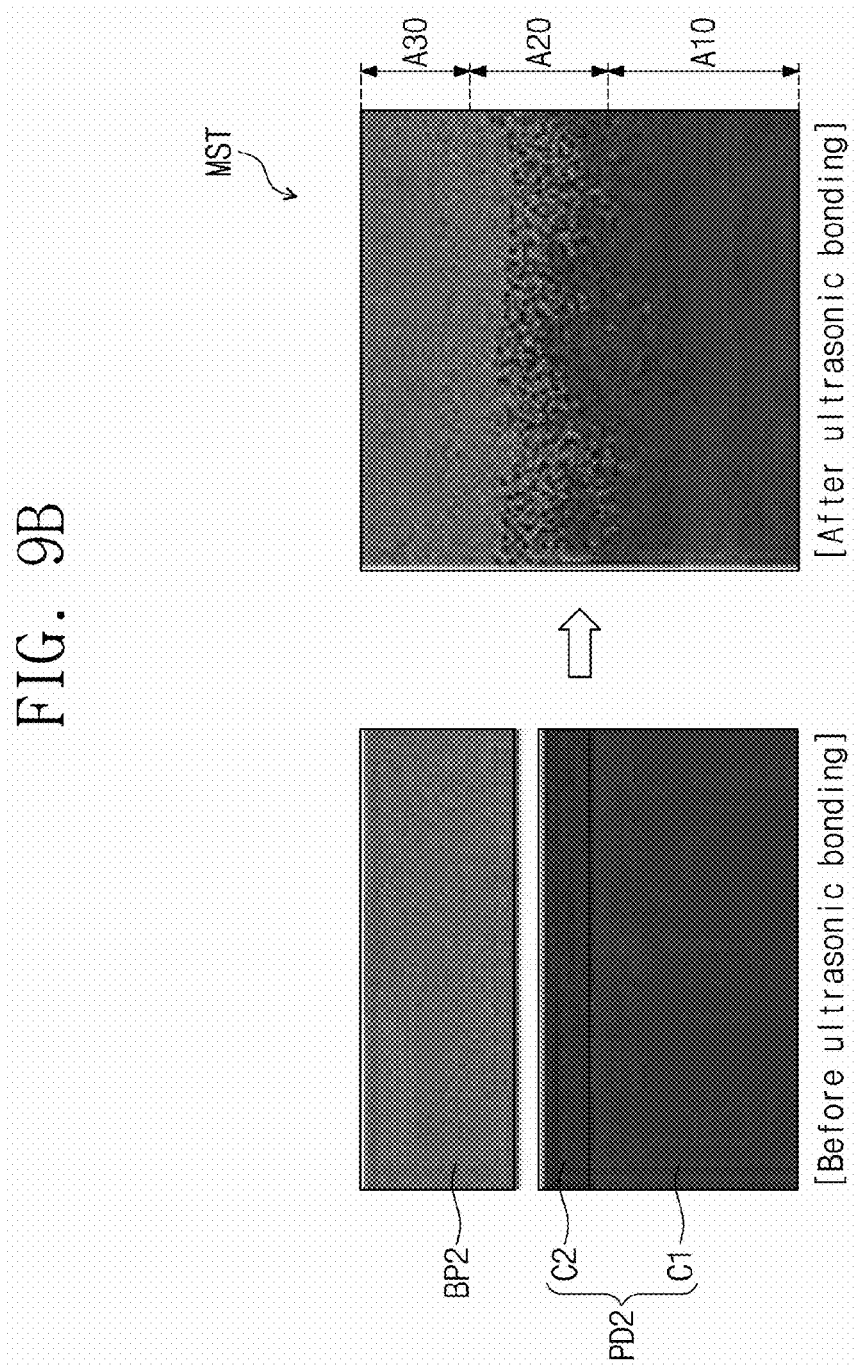

ELECTRONIC DEVICE INCLUDING CONDUCTIVE ADHESIVE LAYER

BACKGROUND

1. Technical Field

The disclosure herein relates to an electronic device, and, to an electronic device including electronic components that are electrically connected to each other.

2. Description of the Related Art

Various electronic devices used in multimedia equipment such as televisions, mobile phones, table computers, navigation devices, and game consoles are being developed. The electronic devices include a plurality of electronic components. The plurality of electronic components may include a display panel, a driving chip, and a circuit board. The electronic components may be electrically connected to each other through various methods.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides an electronic device having improved reliability of electrical bonding.

An embodiment provides an electronic device that may include a first electronic component and a second electronic component. The first electronic component may include a first pad area including first pads and second pads spaced apart from the first pads, wherein a number of the first pads is greater than a number of the second pads. The second electronic component may include first bumps electrically connected to the first pads, and second bumps electrically connected to the second pads, wherein each of the second bumps may have a bonding area greater than a bonding area of each of the first bumps. The electronic device may include a conductive adhesive layer disposed between the first electronic component and the second electronic component to electrically connect the first pads to the first bumps.

In an embodiment, the first electronic component may include a display area adjacent to the first pad area, wherein a pixel may be disposed in the display area, and the second electronic component may include a driving chip.

In an embodiment, the first electronic component may include a second pad area including third pads electrically connected to the second pads.

In an embodiment, the electronic device may further include a circuit board electrically connected to the second pad area.

In an embodiment, the driving chip may receive first signals through the second pads and the second bumps, and the driving chip may provide second signals to the first pads through the first bumps, the second signals being generated based on the first signals.

In an embodiment, the first pads may be disposed in a matrix arrangement including a plurality of rows and a plurality of columns, and the second pads may be disposed in a direction parallel to a row direction of the plurality of rows of the matrix arrangement.

In an embodiment, the first pads may define a first pad row, a second pad row, a third pad row, and a fourth pad row disposed in a first direction, each of the first pad row, the second pad row, the third pad row, and the fourth pad row may include corresponding pads of the first pads, and the corresponding pads of the first pads may be disposed in a second direction intersecting the first direction, and at least a portion of the corresponding pads of the first pads may extend in a direction intersecting the first direction and the second direction in a plan view.

In an embodiment, the conductive adhesive layer may include an adhesive layer; and a single layer of a plurality of conductive balls included in the adhesive layer.

In an embodiment, a portion of the plurality of conductive balls may be disposed between the first pads and the first bumps, and another portion of the plurality of conductive balls may not overlap the first pads and the first bumps.

In an embodiment, the conductive adhesive layer may include a first area and a second area in a plan view, the plurality of conductive balls may be disposed in the first area and the plurality of conductive balls may not be disposed in the second area, the first area of the conductive adhesive layer may overlap the first pads, and the second area of the conductive adhesive layer may overlap the second pads.

In an embodiment, each of the second bumps may have a thickness greater than a thickness of each of the first bumps.

In an embodiment, each of the second bumps may have a multilayered structure of more layers than layer of each of the first bumps.

In an embodiment, each of the first pads and the second pads may include a plurality of laminated conductive layers, and the second pads may include a greater number of the conductive layers than a number of the conductive layers in the first pads.

In an embodiment, a second pad of the second pads and a second bump of the second bumps may constitute one metal structure, the second bump being bonded to the second pad, and the metal structure may include a eutectic region of a first metal and a second metal, wherein the first metal may be different from the second metal.

In an embodiment, the eutectic region may further include a third metal different from each of the first metal and the second metal.

In an embodiment an electronic device may include a display panel including a display area and a pad area adjacent to the display area, the pad area including first pads and second pads, each of the second pads may have a greater surface area than a surface area of each of the first pads; a driving chip including first bumps electrically connected to the first pads; and second bumps electrically connected to the second pads; and an anisotropic conductive adhesive layer disposed between the display panel and the driving chip to electrically connect the first pads to the first bumps.

In an embodiment, a plurality of pixels may be disposed in the display area, the display panel may include signal lines that may electrically connect the first pads to the plurality of pixels, and the driving chip may provide data signals to the plurality of pixels through the signal lines.

In an embodiment, the first pads may define a plurality of pad rows disposed in a first direction, each of the plurality of pad rows may include corresponding pads of the first pads, the corresponding pads of the first pads may be disposed in a second direction intersecting the first direction, and the second pads may define a pad row disposed in the second direction, wherein an interval between pad row closest to the pad row of the second pads among the plurality of pad rows of the first pads, and the pad row of the second pads may be greater than an interval between the plurality of pad rows of the first pads.

In an embodiment, the conductive adhesive layer may include an adhesive layer; and single layer of a plurality of conductive balls included in the adhesive layer.

In an embodiment, the plurality of conductive balls may overlap the plurality of pad rows of the first pads, and the plurality of conductive balls may not be disposed in an area between the pad row closest to the pad row of the second pads among the plurality of pad rows of the first pads, and the pad row of the second pads.

BRIEF DESCRIPTION OF THE DRAWINGS

The accompanying drawings are included to provide a further understanding of the disclosure, and are incorporated in and constitute a part of this specification. The drawings illustrate embodiments and, together with the description, serve to explain principles of the disclosure. In the drawings:

FIG. 9B is a schematic cross-sectional view illustrating a bonded state of a second pad and a second bump according to an embodiment;

DETAILED DESCRIPTION OF THE EMBODIMENTS

Figure 1A:
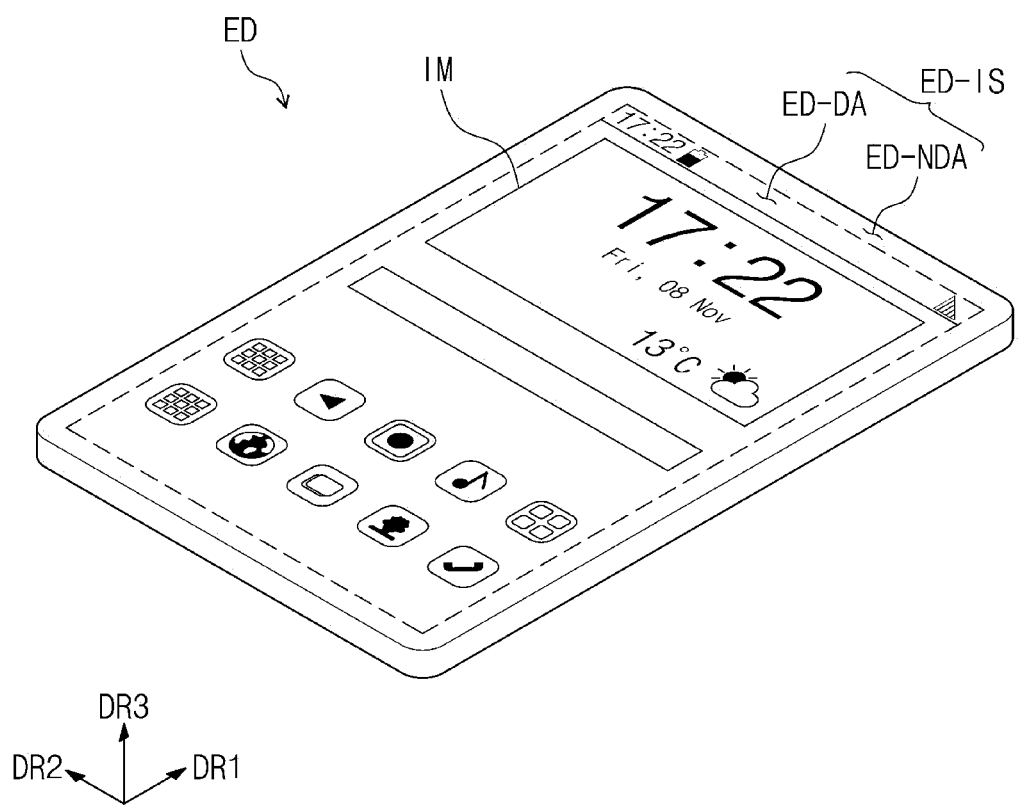
FIG. 1A is a perspective view of an electronic device according to an embodiment.

In this specification, it will also be understood that when one component (or region, layer, portion) is referred to as being "on", "connected to", or "coupled to" another component, it can be directly disposed/connected/coupled on/to the one component, or an intervening third component or other intervening components may also be present.

Like reference numerals refer to like elements throughout. Also, in the figures, the thickness, ratio, and dimensions of components may be exaggerated for clarity of illustration.

The term "and/or" includes any and all combinations of one or more of the associated listed items.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the disclosure and the scope of the appended claims. The terms of a singular form may include plural forms unless referred to the contrary.

Also, "under", "below", "above', "upper", and the like are used for explaining a relative association of components illustrated in the drawings. The terms may be a relative concept and described based on directions expressed in the drawings, however the disclosure is not limited thereto.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by a person of ordinary skill in the art to which this disclosure pertains. Also, terms such as defined terms in commonly used dictionaries are to be interpreted as having meanings consistent with their meaning in the context of the relevant art and will not be interpreted in an ideal or excessively formal sense unless clearly defined in the specification.

The meaning of "include" or "comprise" or "have" and variations of "include", "comprise" and "have" specifies a property, a fixed number, a step, an operation, an element, a component or a combination thereof, but does not exclude other properties, fixed numbers, steps, operations, elements, components or combinations thereof.

Hereinafter, embodiments will be described with reference to the accompanying drawings.

Figure 1B:
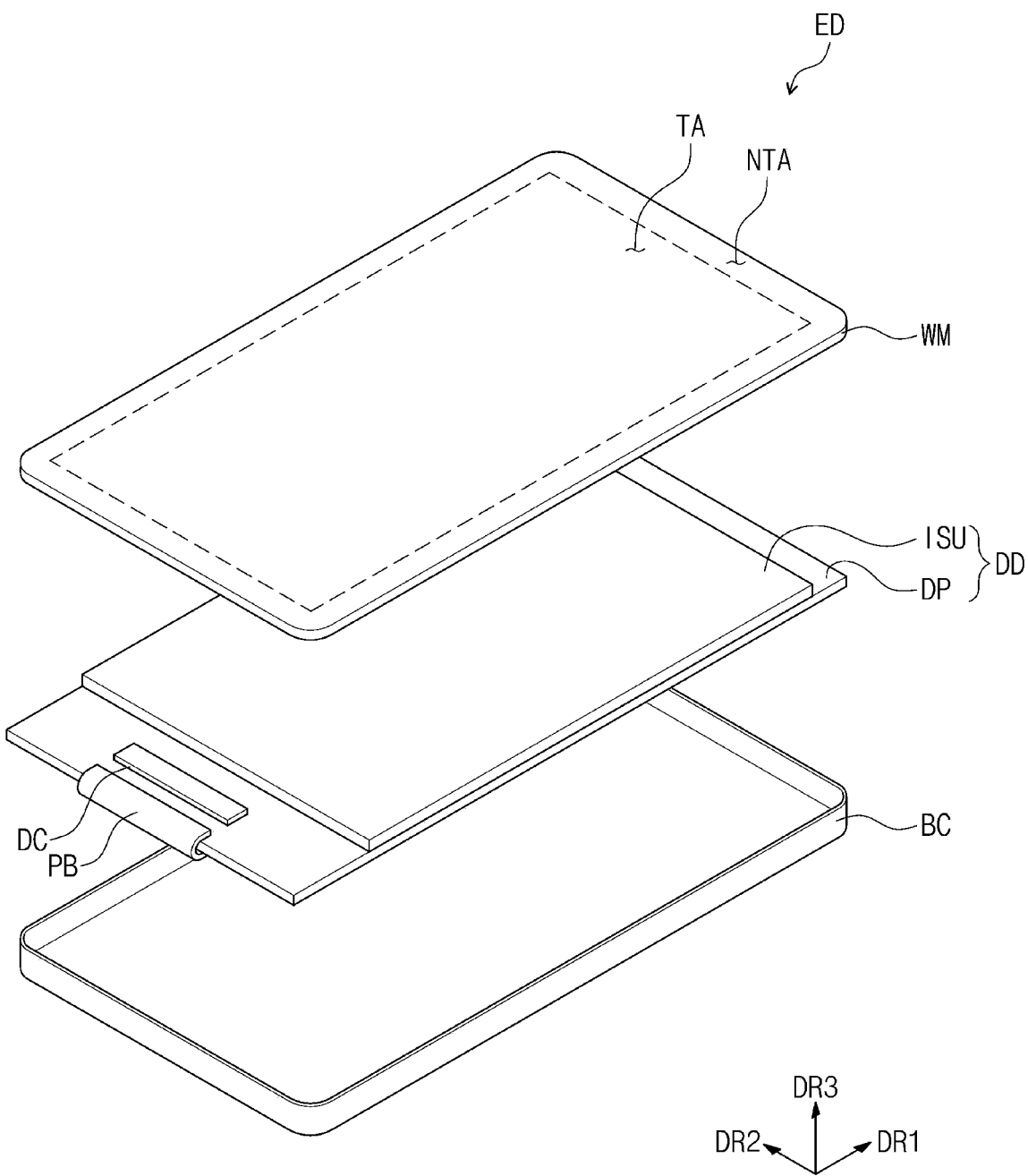
FIG. 1B is an exploded perspective view of the electronic device according to an embodiment.

FIG. 1A is a perspective view of an electronic device ED according to an embodiment. FIG. 1B is an exploded perspective view of the electronic device ED according to an embodiment.

In this specification, a mobile phone terminal is illustrated as the electronic device ED, however, the disclosure is not limited thereto. The electronic device ED according to an embodiment may be applied to large-sized electronic apparatuses such as televisions and monitors and small and middle-sized electronic apparatuses such as a tablet PC, navigation units for vehicles, game consoles, and smart watches.

Referring to FIG. 1A, the electronic device ED may display an image IM through a display surface ED-IS. Icon images are illustrated as an example of the image IM. The display surface ED-IS is parallel to a surface defined by a first direction DR1 and a second direction DR2. A normal direction of the display surface ED-IS, that is, a thickness direction of the electronic device ED may be indicated as a third direction DR3. In this specification, "when viewed in a plan view or on the plane" may mean a case when viewed in the third direction DR3. A front surface (or a top surface) and a rear surface (or a bottom surface) of each of the layers or units, which will be described below, may be distinguished by the third direction DR3. However, the combination of the first to third directions DR1, DR2, and DR3 may be changed to other combinations.

Also, the display surface ED-IS may include a display area ED-DA in which an image IM may be displayed and a non-display area ED-NDA that may be adjacent to or surround the display area ED-DA. The non-display area ED-NDA may be an area in which an image IM may not be displayed. However, an embodiment is not limited thereto. The non-display area ED-NDA may be adjacent to one or a side of the display area ED-DA or may be omitted.

Referring to FIG. 1B, the electronic device ED may include a window WM, a display device DD, and an accommodating member BC. Although not shown, the electronic device ED may further include an optical member disposed between the window WM and the display device DD. The optical member may include a polarizer. The optical member may further include a retarder.

The window WM may be disposed on an upper portion of the display device DD to transmit an image provided from the display device DD to the outside. The window WM may include a transmission area TA and a non-transmission area NTA. The transmission area TA may overlap the display area ED-DA and may have a shape substantially corresponding to the display area ED-DA.

The non-transmission area NTA may overlap the non-display area ED-NDA and have a shape substantially corresponding to the non-display area ED-NDA. The non-transmission area NTA may be an area having a light transmittance that may be relatively less than that of the transmission area TA. A bezel pattern may be disposed on a partial area of a base layer, an area on which the bezel pattern may be disposed may be the non-transmission area NTA, and an area on which the bezel pattern may not be disposed may be the transmission area TA. The base layer of the window WM may be made of glass, sapphire, or plastic, or the like, within the spirit and the scope of the disclosure. However, the disclosure is not limited thereto, and the non-transmission area NTA may be omitted.

The display device DD may generate an image and sense an external input. The display device DD may include a display panel DP and an input sensor ISU.

According to an embodiment, the display panel DP may be an emission type display panel, but is not limited thereto. For example, the display panel DP may be an organic light emitting display panel and a quantum-dot light emitting display panel. A light emitting layer of the organic light emitting display panel may include an organic light emitting material. A light emitting layer of the quantum dot light emitting display panel may include a quantum dot, a quantum rod, and the like within the spirit and the scope of the disclosure. Hereinafter, the organic light emitting display panel will be described as an example of the display panel DP.

The input sensor ISU may include one of a capacitive sensor, an optical sensor, an ultrasonic sensor, and an electromagnetic induction sensor. The input sensor ISU may be formed or disposed on the display panel DP through a continuous process or may be separately manufactured and then attached to an upper side of the display panel DP through an adhesive layer.

The display device DD may further include a driving chip DC and a circuit board PB. An embodiment in which the driving chip DC may be mounted on the display panel DP is illustrated, but is not limited thereto. The driving chip DC may generate a driving signal that may be required for an operation of the display panel DP on the basis of a control signal transmitted from the circuit board PB. The circuit board PB that may be electrically bonded to the display panel DP may be bent and disposed on a rear surface of the display panel DP. The accommodating member BC may accommodate the display device DD and may be coupled or connected to the window WM. The circuit board PB may be disposed on an end of the base substrate SUB (see FIG. 2) and may be electrically connected to the circuit element layer DP-CL (see FIG. 2).

Although not shown, the electronic device ED may further include a main board, electronic modules mounted or disposed on the main board, a camera module, and a power module.

Although the mobile phone terminal has been described as the electronic device ED, in this specification, it may be sufficient if the electronic device ED may include two or more electronic components that may be electrically bonded to each other. The display panel DP and the driving chip DC mounted or disposed on the display panel DP may respectively correspond to different electronic components, and the electronic device ED may be constituted by only the display panel DP and the driving chip DC. The electronic device ED may be constituted by only the display panel DP and the circuit board PB may be electrically connected to the display panel DP. Also, the electronic device ED may be constituted by only the main board and the electronic module mounted or disposed on the main board. Hereinafter, the electronic device ED will be described based on a bonding structure between the display panel DP and the driving chip DC mounted or disposed on the display panel DP.

Figure 2:
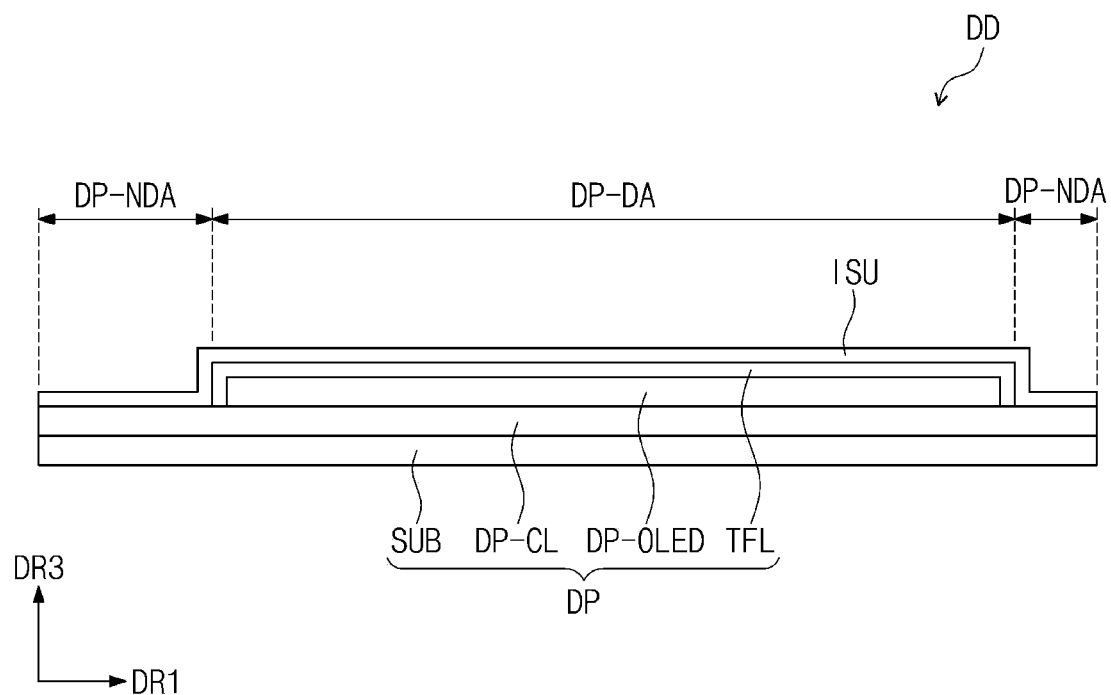
FIG. 2 is a schematic cross-sectional view of a display device according to an embodiment.
Figure 3:
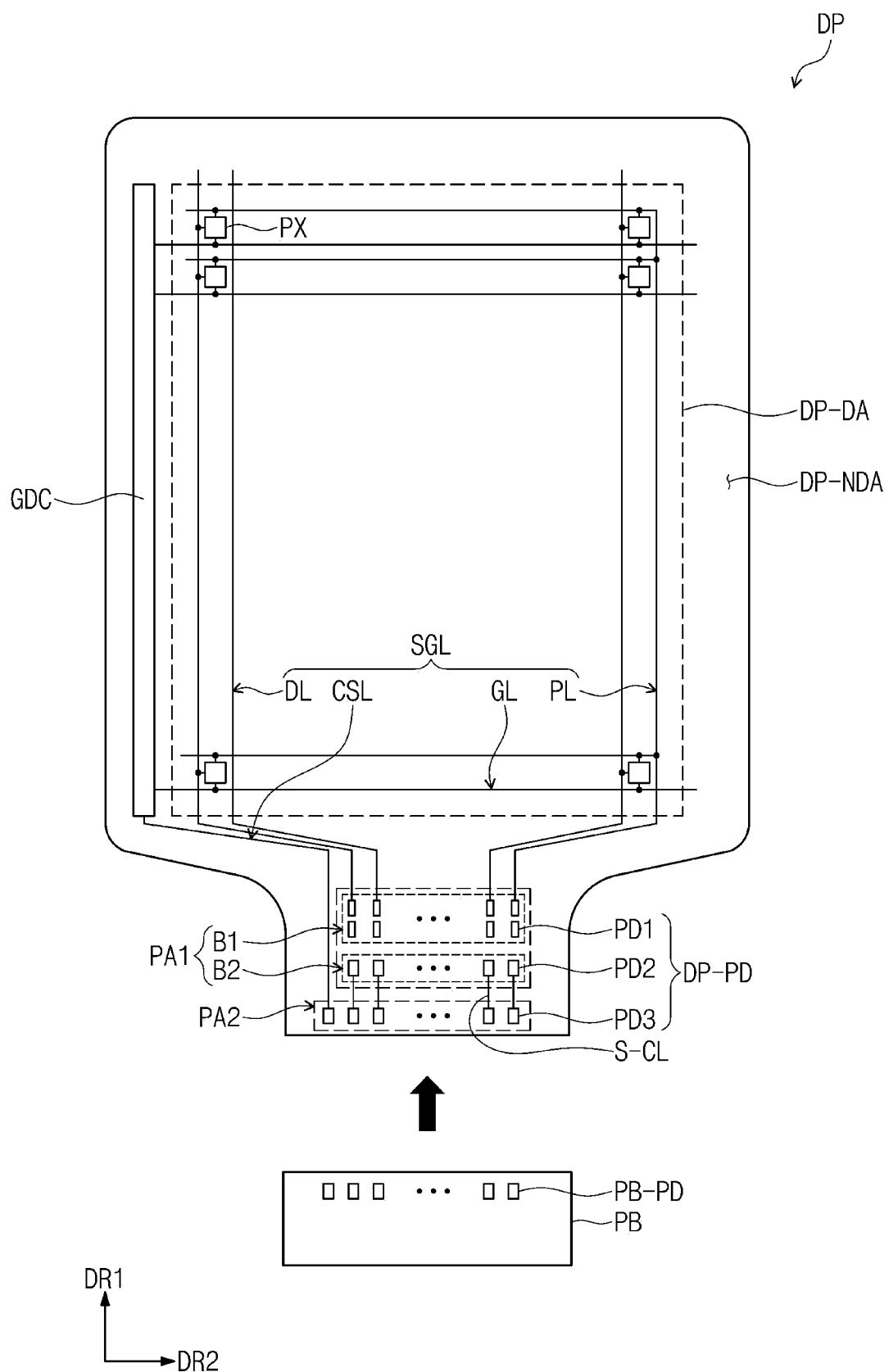
FIG. 3 is a plan view of a display panel according to an embodiment.
Figure 4:
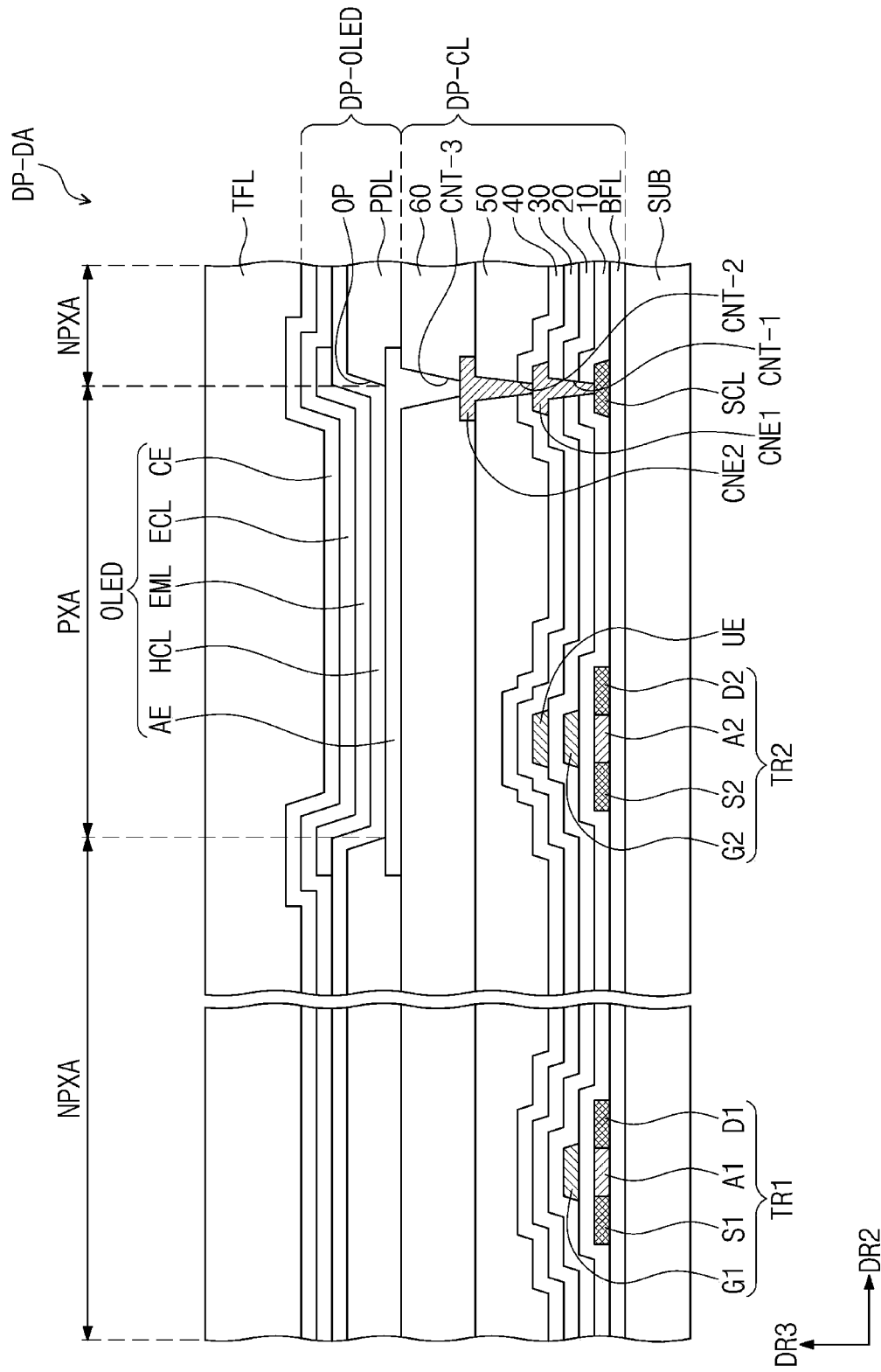
FIG. 4 is a schematic cross-sectional view of the display panel according to an embodiment.
Figure 5:
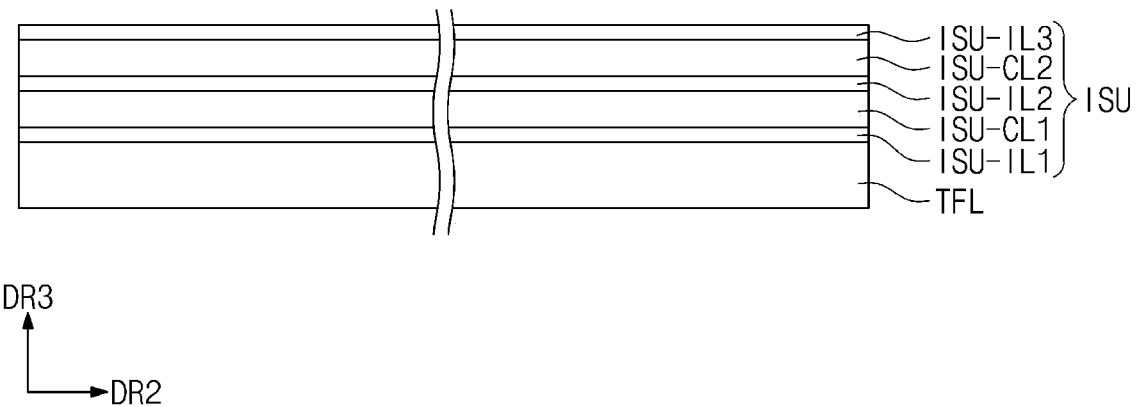
FIG. 5 is a schematic cross-sectional view of an input sensor according to an embodiment.

FIG. 2 is a schematic cross-sectional view of the display device DD according to an embodiment. FIG. 3 is a plan view of the display panel DP according to an embodiment. FIG. 4 is a schematic cross-sectional view of the display panel DP according to an embodiment. FIG. 5 is a schematic cross-sectional view of an input sensor ISU according to an embodiment.

Referring to FIG. 2, the display panel DP may include a base substrate SUB, a circuit element layer DP-CL disposed on the base substrate SUB, a display element layer DP-OLED, and an upper insulating layer TFL. The input sensor ISU may be disposed on the upper insulating layer TFL.

The display panel DP may include a display area DP-DA and a non-display area DP-NDA. The display area DP-DA of the display panel DP may correspond to the display area ED-DA of FIG. 1A or the transmission area TA of FIG. 1B, and the non-display area DP-NDA may correspond to the non-display area ED-NDA of FIG. 1A or the non-transmission area NTA of FIG. 1B.

The base substrate SUB may include at least one plastic film. The base substrate SUB may include a plastic substrate, a glass substrate, a metal substrate, or an organic/inorganic composite substrate as a flexible board, but the disclosure is not limited thereto.

The circuit element layer DP-CL may include at least one intermediate insulating layer and a circuit element. The intermediate insulating layer may include at least one intermediate inorganic layer and at least one intermediate organic layer. The circuit element may include signal lines, a driving circuit of a pixel, and the like within the spirit and the scope of the disclosure.

The display element layer DP-OLED may include a plurality of organic light emitting diodes. The display element layer DP-OLED may further include an organic layer such as a pixel defining layer. The upper insulating layer TFL may seal the display element layer DP-OLED. For example, the upper insulating layer TFL may be a thin film encapsulation layer. The thin film encapsulation layer may include a laminated structure of an inorganic layer/an organic layer/an inorganic layer. The upper insulating layer TFL may protect the display element layer DP-OLED against foreign substances such as moisture, oxygen, and dust particles. However, the disclosure is not limited thereto, and the upper insulating layer TFL may further include an additional insulating layer in addition to the thin film encapsulation layer. For example, the upper insulating layer TFL may further include an optical insulating layer for controlling a refractive index.

In an embodiment, an encapsulation substrate may be provided in place of the upper insulating layer TFL. In this case, the encapsulation substrate may be opposite to the base substrate SUB, and the circuit element layer DP-CL and the display element layer DP-OLED may be disposed between the encapsulation substrate and the base substrate SUB.

The input sensor ISU may be directly disposed on the display panel DP. In this specification, that "a constituent or element A is directly disposed on a constituent or element B" may mean that an adhesive member is not disposed between the constituents or elements A and B. In an embodiment, the input sensor ISU may be manufactured together with the display panel DP through a continuous process. However, the disclosure is not limited thereto. For example, the input sensor ISU may be provided as an individual panel and then may be coupled or connected to the display panel DP through the adhesive layer. For another example, the input sensor ISU may be omitted.

Referring to FIG. 3, the display panel DP may include a plurality of pixels PX, a gate driving circuit GDC, a plurality of signal lines SGL, and a plurality of pads DP-PD.

The pixels PX may be disposed in the display area DP-DA. Each of the pixels PX may include an organic light emitting diode and a pixel driving circuit electrically connected to the organic light emitting diode. The gate driving circuit GDC and the signal lines SGL may be included in the circuit element layer DP-CL illustrated in FIG. 2.

The gate driving circuit GDC may sequentially output gate signals to the plurality of gate lines GL. The gate driving circuit GDC may include a plurality of thin film transistors that may be manufactured through the same process as the driving circuit of the pixel PX, for example, a low temperature polycrystalline silicon (LTPS) process or a low temperature polycrystalline oxide (LTPO) process. The display panel DP may further include another driving circuit that may provide emission control signals to the pixels PX.

The signal lines SGL include gate lines GL, data lines DL, a power line PL, and a control signal line CSL. The gate lines GL may be respectively electrically connected to corresponding pixels PX of the pixels PX, and the data lines DL may be respectively electrically connected to corresponding pixels PX of the pixels PX. The power line PL may be electrically connected to the pixels PX. The control signal line CSL may provide control signals to the scan driving circuit.

The signal lines SGL may overlap the display area DP-DA and the non-display area DP-NDA. Each of the signal lines SGL may include a pad part and a line part. The line part may overlap the display area DP-DA and the non-display area DP-NDA. The pad part may be electrically connected to an end portion of the line part. The pad part may overlap a pad area to be described later.

The plurality of pads DP-PD may include first pads PD1, second pads PD2, and third pads PD3. An area in which the first pads PD1 and second pads PD2 may be disposed may be defined or referred to as a first pad area PA1, and an area in which the third pads PD3 may be disposed may be defined or referred to as a second pad area PA2. The first pad area PA1 may be an area bonded to the driving chip DC (see FIG. 1B), and the second pad area PA2 may be an area bonded to the circuit board PB (see FIG. 1B). The first pad area PA1 may include a first area B1 in which the first pads PD1 may be disposed and a second area B2 in which the second pads PD2 may be disposed. The first pad area PA1 and the second pad area PA2 may be disposed inside the non-display area DP-NDA. At least some or a predetermined number of the first pads PD1 may be electrically connected to the data lines DL, respectively.

The first pad area PA1 and the second pad area PA2 may be spaced apart from each other in the first direction DR1. The second pads PD2 and the third pads PD3 may be electrically connected to each other through connection signal lines S-CL. Although two pad rows are illustrated as an example in the first area B1, an embodiment is not limited thereto. For example, more pad rows may be disposed. The third pads PD3 may be bonded to the circuit pads PB-PD of the circuit board PB. The third pads PD3 may be bonded to the circuit pads PB-PD through an anisotropic conductive adhesive layer or a solder bump.

Referring to FIG. 4, the display area DP-DA may include an emission area PXA and a non-emission area NPXA. Each of the pixels PX may include an organic light emitting diode OLED and a pixel driving circuit electrically connected to the organic light emitting diode OLED. In detail, the pixel PX may include a first transistor TR1, a second transistor TR2, and an organic light emitting diode OLED. Some or a predetermined number of the transistors TR1 and TR2 in the pixel driving circuit are illustrated.

Referring to FIG. 4, the display panel DP may include a plurality of insulating layers, a semiconductor pattern, a conductive pattern, a signal line, and the like within the spirit and the scope of the disclosure. The insulating layer, the semiconductor layer, and the conductive layer may be formed in a manner such as coating, deposition, or the like within the spirit and the scope of the disclosure. Thereafter, the insulating layer, the semiconductor layer, and the conductive layer may be selectively patterned by a photolithography process. The semiconductor pattern, the conductive pattern, and the signal line, which may be provided in the circuit element layer DP-CL and the display element layer DP-OLED, may be formed in the above-described manner.

The base substrate SUB may include a synthetic resin film. The base substrate SUB may have a multi-layered structure. For example, the base substrate SUB may have a three-layered structure of a synthetic resin layer, an inorganic layer, and a synthetic resin layer. As an example, the synthetic resin layer may be a polyimide resin layer, and the material thereof is not particularly limited. The synthetic resin layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, and a perylene-based resin. For example, the synthetic resin layer may include a glass substrate, a metal substrate, or an organic/inorganic composite substrate.

At least one inorganic layer may be disposed on a top surface of the base substrate SUB. The inorganic layer may include at least one of aluminum oxide, titanium oxide, silicon oxide, silicon nitride, silicon oxynitride, zirconium oxide, and hafnium oxide. The inorganic layer may be provided as a multilayer. The multilayered inorganic layer may constitute a barrier layer and/or a buffer layer. In an embodiment, the display panel DP may include the buffer layer BFL.

The semiconductor pattern may be disposed on the buffer layer BFL. The semiconductor pattern may include polysilicon. However, an embodiment is not limited thereto. For example, the semiconductor pattern may include amorphous silicon or a metal oxide.

FIG. 4 illustrates a portion of the semiconductor pattern. For example, the semiconductor pattern may be further disposed in other areas of the pixel PX in a plan view. The semiconductor pattern may be arranged or disposed in a given arrangement over the pixels PX. The semiconductor pattern has different electrical properties depending on whether the semiconductor pattern is doped. The semiconductor pattern may include a first area and a second area. The first area may be doped with an N-type dopant or a P-type dopant. A P-type transistor may include a doped region into which the P-type dopant may be doped.

The first area may have a conductivity greater than that of the second area and may substantially serve as an electrode or a signal line. The second area may have a low doping concentration or may be a non-doped region and may substantially correspond to an active (or channel) of the transistor. For example, a portion of the semiconductor pattern may be an active portion or region of the transistor, another portion may be a source or drain of the transistor, and further another portion may be a connection electrode or a connection signal line.

As illustrated in FIG. 4, a source S1, an active (or channel) A1, and a drain D1 of a first transistor TR1 may be formed from the semiconductor pattern, and a source S2, an active (or a channel) A2, and a drain D2 of the second transistor TR2 may be formed from the semiconductor pattern. The sources S1 and S2 and the drains D1 and D2 may extend from the actives (or channels) A1 and A2 in directions opposite to each other. FIG. 4 illustrates a portion of a connection signal line SCL formed from the semiconductor pattern. Although not particularly shown, the connection signal line SCL may be electrically connected to the drain D2 of the second transistor TR2 in a plan view. Another transistor may be disposed between the connection signal line SCL and the drain D2 of the second transistor TR2.

A first insulating layer 10 may be disposed on the buffer layer BFL. The first insulating layer 10 may commonly overlap the plurality of pixels PX and may cover or overlap the semiconductor pattern. Gates G1 and G2 may be disposed on the first insulating layer 10. Each of the gates G1 and G2 may be a portion of the metal pattern. The gates G1 and G2 may overlap the actives (or channels) A1 and A2. In the process of doping the semiconductor pattern, the gates G1 and G2 may serve as masks.

A second insulating layer 20 covering or overlapping the gates G1 and G2 may be disposed on the first insulating layer 10. The second insulating layer 20 may commonly overlap the pixels PX. An upper electrode UE may be disposed on the second insulating layer 20. The upper electrode UE may overlap the gate G2 of the second transistor TR2. The upper electrode UE may be a portion of the metal pattern. A portion of the gate G2 and the upper electrode UE overlapping the portion of the gate G2 may define or form the capacitor.

A third insulating layer 30 covering or overlapping the upper electrode UE may be disposed on the second insulating layer 20. The first connection electrode CNE1 disposed on the third insulating layer 30 may be electrically connected to the connection signal line SCL through a contact hole CNT-1 passing through the first to third insulating layers 10 to 30.

A fourth insulating layer 40 covering or overlapping the first connection electrode CNE1 may be disposed on the third insulating layer 30. The first insulating layer 10 to the fourth insulating layer 40 may include an inorganic layer and/or an organic layer and may have a single-layered or multilayered structure. The first insulating layer 10 may include at least one of aluminum oxide, titanium oxide, silicon oxide, silicon oxynitride, silicon nitride, zirconium oxide, and hafnium oxide. The fifth insulating layer 50 may be disposed on a fourth insulating layer 40. The fifth insulating layer 50 may be an organic layer. A second connection electrode CNE2 may be disposed on the fifth insulating layer 50. The second connection electrode CNE2 may be electrically connected to the first connection electrode CNE1 through a contact hole CNT-2 passing through the fourth insulating layer 40 and the fifth insulating layer 50.

A sixth insulating layer 60 covering or overlapping the second connection electrode CNE2 may be disposed on the fifth insulating layer 50. The sixth insulating layer 60 may be an organic layer. A first electrode AE may be disposed on the sixth insulating layer 60. The first electrode AE may be electrically connected to the second connection electrode CNE2 through a contact hole CNT-3 passing through the sixth insulating layer 60. An opening OP may be defined or formed in the pixel defining layer PDL. An opening OP of the pixel defining layer PDL may expose at least a portion of the first electrode AE. In an embodiment, the emission area PXA may correspond to a portion of an area of the first electrode AE exposed by the opening OP.

A hole control layer HCL may be commonly disposed in the emission area PXA and the non-emission area NPXA. The hole control layer HCL may include a hole transport layer and may further include a hole injection layer. The light emitting layer EML may be disposed on the hole control layer HCL. The light emitting layer EML may be disposed in an area corresponding to the opening OP. For example, the light emitting layer EML may be formed to be separated from each of the pixels PX.

An electron control layer ECL may be disposed on the light emitting layer EML. The electron control layer ECL may include an electron transport layer and may further include an electron injection layer. The hole control layer HCL and the electron control layer ECL may be commonly formed in the plurality of pixels PX by using an open mask. The second electrode CE may be disposed on the electron control layer ECL. The second electrode CE may be provided as a single body and commonly disposed in the plurality of pixels PX. An upper insulating layer TFL may be disposed on the second electrode CE. The upper insulating layer TFL may include a plurality of thin films.

As illustrated in FIG. 5, the input sensor ISU may be directly disposed on the upper insulating layer TFL. The input sensor ISU may include a first input insulating layer ISU-ILL a first conductive layer ISU-CL1, a second input insulating layer ISU-IL2, a second conductive layer ISU-CL2, and a third input insulating layer ISU-IL3. The first input insulating layer ISU-IL1 may be directly disposed on the upper insulating layer TFL. In an embodiment, the first input insulating layer ISU-IL1 may be omitted.

Each of the first conductive layer ISU-CL1 and the second conductive layer ISU-CL2 may have a single-layered structure or a multi-layered structure in which a plurality of layers may be laminated in the third direction DR3. The conductive layer having the multi-layered structure may include at least two of the transparent conductive layers and the metal layers. The conductive layer having the multi-layered structure may include metal layers including metals different from each other. The transparent conductive layer may include indium tin oxide (ITO), indium zinc oxide (IZO), zinc oxide (ZnO), or indium tin zinc oxide (ITZO), polyethylenedioxythiophene (PEDOT), a metal nano wire, and graphene. The metal layer may be formed of molybdenum, silver, titanium, copper, aluminum, and an alloy thereof. For example, each of the first and second conductive layers ISU-CL1 and ISU-CL2 may have a three-layered metal structure, for example, a three-layered structure of titanium/aluminum/titanium. A metal having relatively high durability and low reflectance may be applied to an outer layer, and a metal having high electrical conductivity may be applied to an inner layer.

Each of the first and second conductive layers ISU-CL1 and ISU-CL2 may include a plurality of conductive patterns. Hereinafter, an example in which the first conductive layer ISU-CL1 may include first conductive patterns, and the second conductive layer ISU-CL2 may include second conductive patterns will be described. Each of the first and second conductive patterns may include sensing electrodes and signal lines electrically connected to the sensing electrodes. The sensing electrodes of the first conductive patterns and the sensing electrodes of the second conductive patterns may cross or intersect to be insulated from each other.

Each of the first input insulating layer ISU-IL1 to the third input insulating layer ISU-IL3 may include an inorganic or organic layer. In an embodiment, each of the first input insulating layer ISU-IL1 and the second input insulating layer ISU-IL2 may be an inorganic layer. The inorganic layer may include at least one of aluminum oxide, titanium oxide, silicon oxide, silicon oxynitride, silicon nitride, zirconium oxide, and hafnium oxide. The third input insulating layer ISU-IL3 may include an organic layer. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, or a perylene-based resin.

Figure 6:
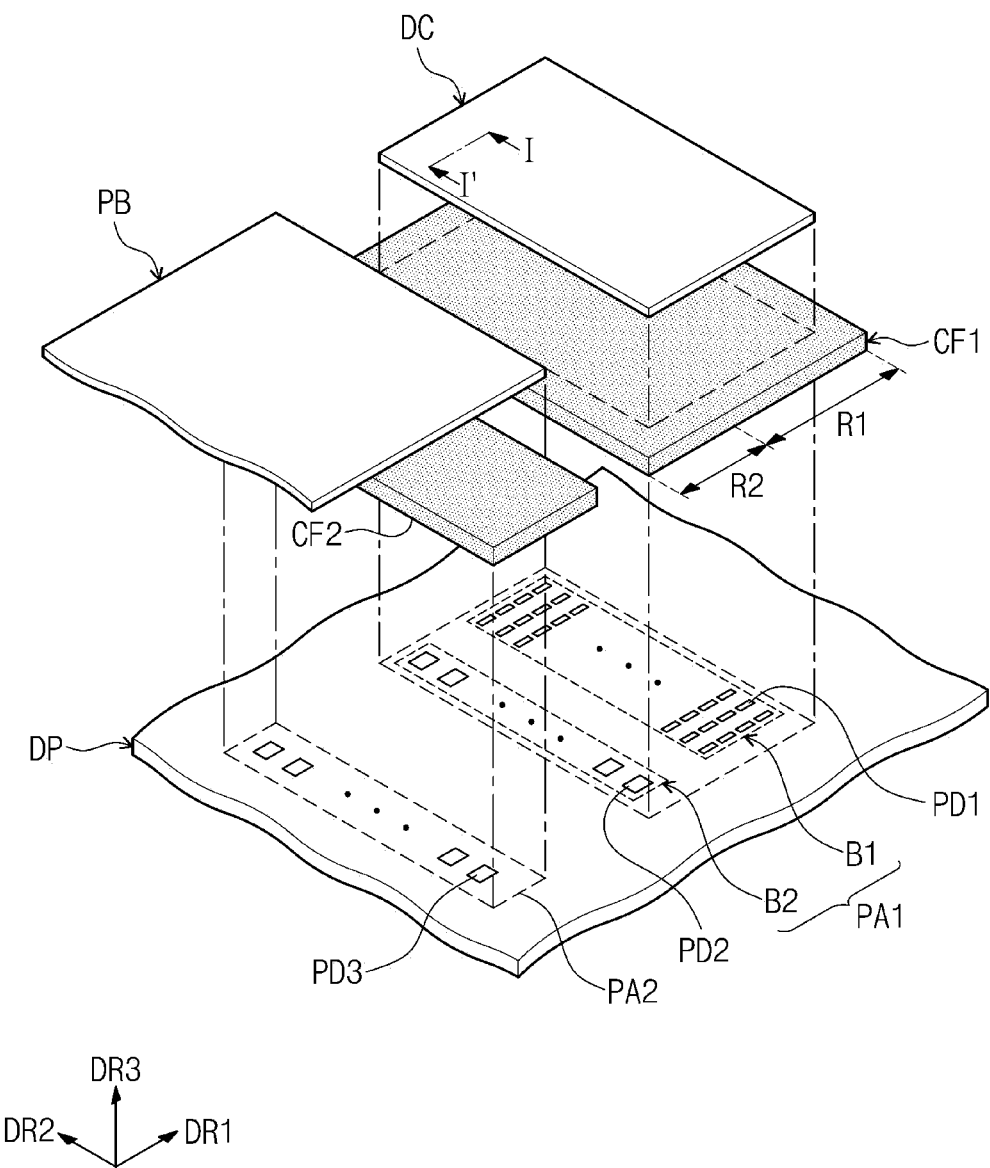
FIG. 6 is an exploded perspective view illustrating a bonding area of the electronic device according to an embodiment.
Figure 7:
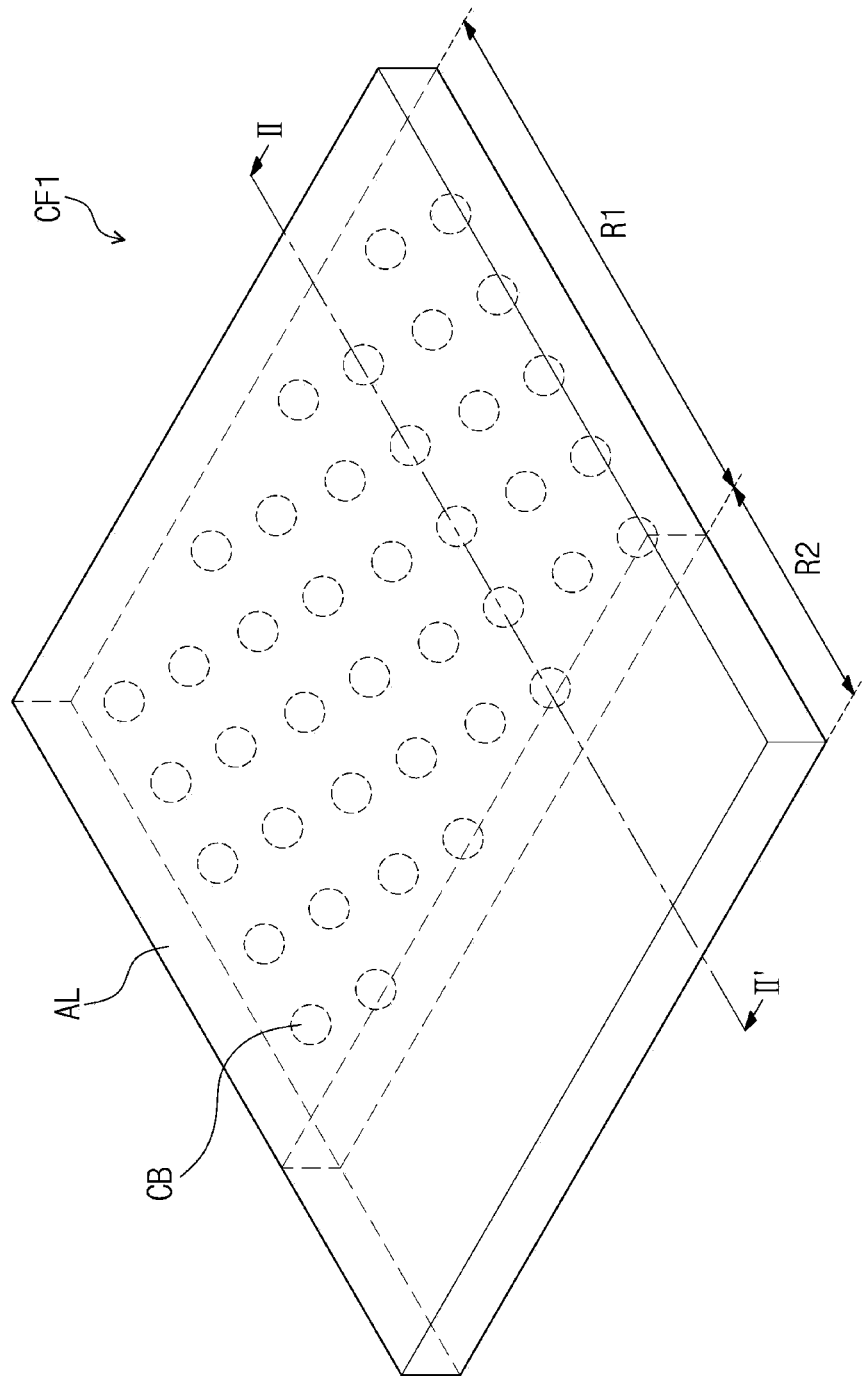
FIG. 7 is a perspective view of a first conductive adhesive layer according to an embodiment.
Figure 8:
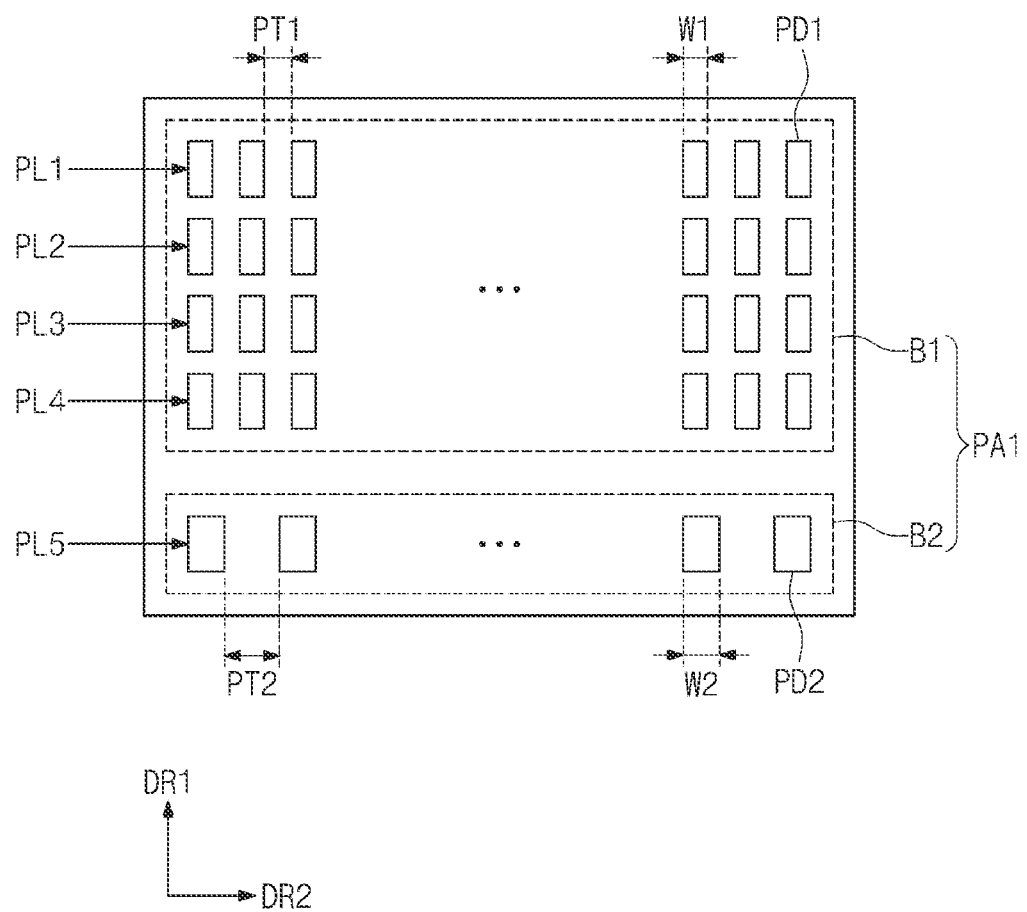
FIG. 8 is a plan view illustrating a first pad area of the display panel according to an embodiment.
Figure 9A:
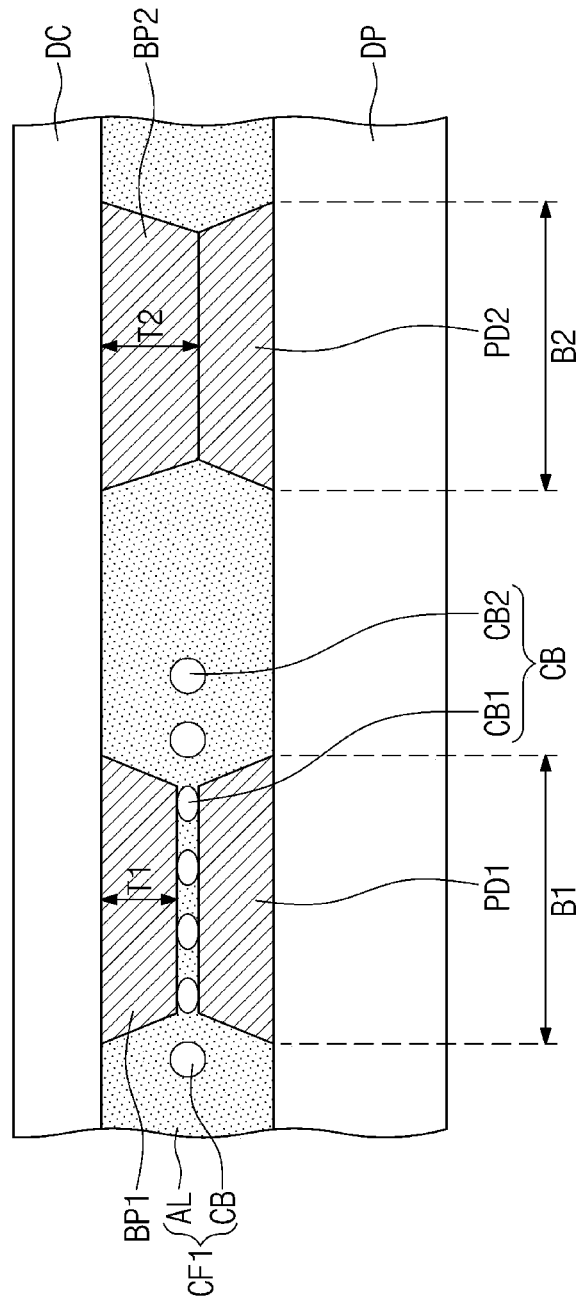
FIG. 9A is a schematic cross-sectional view illustrating the bonding area of the electronic device according to an embodiment.
Figure 10A:
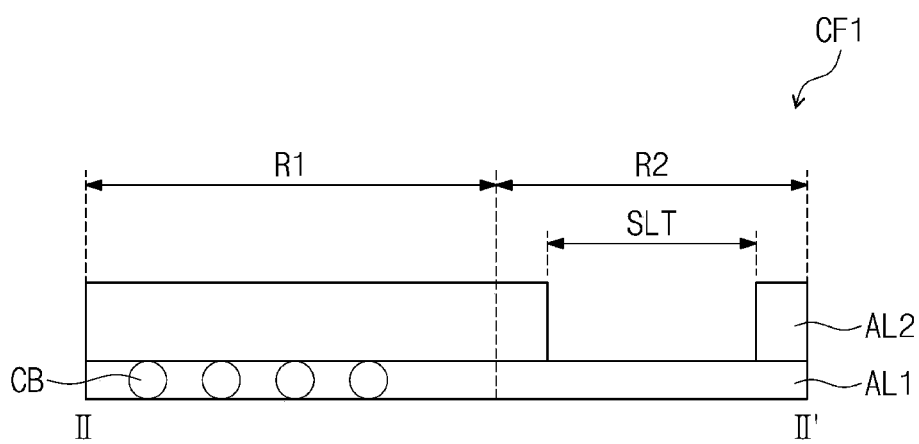
FIGS. 10A and 10B are schematic cross-sectional views of the first conductive adhesive layer according to an embodiment, which is taken along line II-II' of FIG. 7.
Figure 10B:
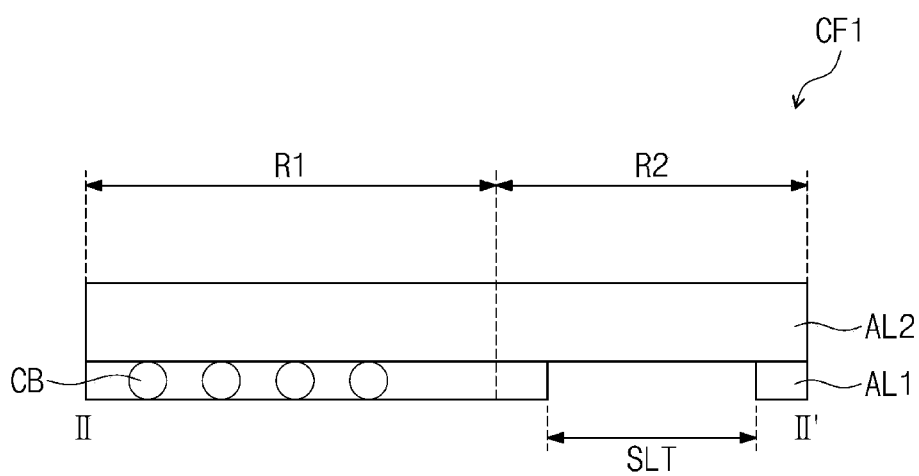

FIG. 6 is an exploded perspective view illustrating a bonding area according to an embodiment. FIG. 7 is a perspective view of a first conductive adhesive layer CF1 according to an embodiment. FIG. 8 is a plan view illustrating a first pad area PA1 of the display panel DP according to an embodiment. FIG. 9A is a schematic cross-sectional view illustrating the bonding area according to an embodiment. FIG. 9B is a schematic cross-sectional view illustrating a bonded state of a second pad PD2 and a second bump BP2 according to an embodiment. FIGS. 10A and 10B are schematic cross-sectional views of the first conductive adhesive layer CF1 according to an embodiment, which is taken along line II-II' of FIG. 7.

As illustrated in FIG. 6, the driving chip DC may be bonded to the first pad area PA1 through the first conductive adhesive layer CF1, and the circuit board PB may be bonded to the second pad area PA2 through the second conductive adhesive layer CF2. Although not shown in FIG. 6, the driving chip DC may include first bumps that may be respectively electrically connected to the first pads PD1 and second bumps that may be respectively electrically connected to the second pads PD2. FIG. 9A illustrates schematic cross-sectional views of one first bump BP1 and one second bump BP2.

The driving chip DC may receive first signals from the outside through the second pads PD2 and the second bumps BP2. The driving chip DC may provide second signals generated based on the first signals to the first pads PD1 through the first bumps BP1. For example, the driving chip DC may include a data driving circuit. The first signal may be an image signal that may be a digital signal applied from the outside, and the second signal may be a data signal that may be an analog signal. The driving chip DC may generate an analog voltage corresponding to a gradation value of an image signal. The data signal may be provided to the pixel PX through the data line DL illustrated in FIG. 3.

Referring to FIGS. 6 and 7, the first conductive adhesive layer CF1 may include an adhesive layer AL and a plurality of conductive balls CB that may be mixed with the adhesive layer AL and provided in a single layer. The conductive balls CB may be aligned in a predetermined shape. The first conductive adhesive layer CF1 having a uniform thickness is illustrated as an example. The first conductive adhesive layer CF1 may be formed in the following manner, but the disclosure is not limited thereto. The conductive balls CB may be arranged or disposed in a predetermined shape using a mesh pattern. Thereafter, a binder may be applied to form the adhesive layer AL surrounding the conductive balls CB.

The first conductive adhesive layer CF1 may include a first area R1 in which the conductive balls CB may be disposed and a second area R2 in which the conductive balls CB may not be disposed. The conductive balls CB may be disposed between the first pads PD1 and the first bumps BP1 to electrically connect the first pads PD1 and the first bumps BP1 to each other. A diameter of each of the conductive balls CB may be less than an interval PT1 between the first pads PD1 to be described later. The first area R1 may overlap the first pads PD1, and the second area R2 may overlap the second pads PD2.

The second conductive adhesive layer CF2 may include only a region corresponding to the first area R1 of the first conductive adhesive layer CF1. The second conductive adhesive layer CF2 may include an anisotropic conductive adhesive layer.

FIGS. 6 and 8 illustrate a first area B1 in which first to fourth pad rows PL1 to PL4 may be disposed. Each of the first to fourth pad rows PL1 to PL4 in the first area B1 may include corresponding first pads PD1 arranged or disposed in the second direction DR2 among the first pads PD1. The first to fourth pad rows PL1 to PL4 may be arranged or disposed in the first direction DR1. Some or a predetermined number of the first pads PD1 of the first to fourth pad rows PL1 to PL4 may be aligned in the first direction DR1 to define a pad row. The first pads PD1 may be arranged or disposed in a matrix.

The first pads PD1 may be disposed more densely than the second pads PD2 to be described later. In other words, there may be a greater number of first pads PD1 than a number of second pads PD2. In the unit area, the first pads PD1 are disposed more than the second pads PD2. The unit area is a certain area for determining the number of pads and is not limited to an area of a specific value. A width W1 of the first pads PD1 may be in a range of about 14 micrometers (μm) to about 18 micrometers (μm). The width may correspond to a short length and may be a length in the second direction DR2 in an embodiment. The interval PT1 between the first pads PD1 may be in a range of about 25 micrometers (μm) to about 30 micrometers (μm). A width W2 of the second pads PD2 may be in a range of about 30 micrometers (μm) to about 35 micrometers (μm). An interval PT2 between the second pads PD2 may be in a range of about 40 micrometers (μm) to about 50 micrometers (μm).

The second pads PD2 may be provided less or may be fewer than the first pads PD1. In an embodiment, the second area B2 defining one pad row PL5 is illustrated as an example. The second area B2 may be disposed to be spaced apart from the first area B1 in the first direction DR1. An interval between the first area B1 and the second area B2 in the first direction DR1 may be greater than that between the adjacent pad rows among the first to fourth pad rows PL1 to PL4 in the first direction DR1.

In a plan view, each of the second pads PD2 may have a surface area greater than that of each of the first pads PD1. Although not shown separately, each of the second bumps BP2 may have a bonding area greater than that of each of the first bumps BP1 in a plan view. An arrangement manner of a surface of the driving chip DC on which the first bumps BP1 and the second bumps BP2 may be disposed may be the same as that of FIG. 8 in a plan view. The bonding area of each of the second bumps BP2 may be equal to or greater than the surface area of each of the second pads PD2. The bonding area of each of the first bumps BP1 may be equal to or greater than the surface area of each of the first pads PD1. A ratio of the bonding area of each of the first bumps BP1 and each of the second bumps BP2 may be the same as a ratio of the surface area of each of the first pads PD1 and each of the second pads PD2.

The second pad PD2 having a large surface area may increase in contact area with the second bump BP2 to be described later. Therefore, contact resistance may be reduced, and current characteristics may be improved. However, an embodiment is not limited thereto. For example, each of the second pads PD2 may have substantially the same surface area as each of the first pads PD1 according to an embodiment. For example, a pressure may be applied to the driving chip DC in the bonding process of the driving chip DC and the display panel DP, and the two types of bumps BP1 and BP2 may uniformly disperse the applied pressure. Since each of the second bumps BP2 having the relatively small number may have a larger surface area, the pressure may be dispersed.

FIG. 9A illustrates a schematic cross-section corresponding to one first pad PD1 and one second pad PD2. One first pad PD1 is described to represent other first pads, and one second pad PD2 is described to represent other second pads.

Referring to FIGS. 6 and 9A, a portion of the conductive balls CB1 (hereinafter, referred to as a first conductive ball) among the conductive balls CB may be disposed between the first pad PD1 and the first bump BP1, and a portion of the conductive ball CB2 (hereinafter, referred to as a second conductive ball) among the conductive balls CB may not overlap the first pad PD1 and the first bump BP1. The adhesive layer AL may physically couple or connect the driving chip DC to the display panel DP.

The first conductive ball CB1 may electrically connect the first pad PD1 to the first bump BP1. Since the adhesive layer AL may be cured while being pressed with a predetermined pressure, the first conductive ball CB1 may have a shape that may be deformed compared to the second conductive ball CB2.

The second pad PD2 and the second bump BP2 may be directly electrically connected to each other. The second pad PD2 and the second bump BP2 may be bonded in an ultrasonic process. FIG. 9B is a view illustrating results obtained by comparing the second pad PD2 and the second bump BP2 before the bonding using the ultrasonic process with a metal structure MST defined by the second pad PD2 and the second bump BP2 after the bonding. The second pad PD2 including the first layer C1 and the second layer C2 and the single-layered second bump BP2 are illustrated as an example. In an embodiment, the first layer C1 may include aluminum (Al), the second layer C2 may include titanium (Ti), and the second bump BP2 may include gold (Au).

The metal structure MST may include a eutectic region A20 of first and second metals different from each other. The first metal may be a material constituting a bonding surface of the second pad PD2, and the second metal may be a material constituting a bonding surface of the second bump BP2. In an embodiment, the first metal may be titanium (Ti), and the second metal may be gold (Au). Titanium (Ti) and gold (Au) may be diffused into opposite regions by application of ultrasonic waves provided by a bonding equipment. The eutectic region may further include a third metal different from each of the first metal and the second metal. As a result, one second pad PD2 and the second bump BP2 form one metal structure MST. The metal structure MST may further include a first metal region A10 disposed at one or a side of the eutectic region A20 and further include a second metal region A30 disposed at the other or another side of the eutectic region A20. Both the first metal region A10 and the second metal region A30 may have properties similar to those of the eutectic region A20 according to a degree of the diffusion of the first metal and the second metal. However, an amount of metal diffusion may vary depending on the region.

To disperse the pressure applied to the driving chip DC in the bonding process, a thickness T2 of the second bump BP2 may be greater than a thickness T1 of the first bump BP1. In a case that the first pad PD1 and the second pad PD2 may have the same thickness, a height difference occurring by the conductive ball CB may be removed by a difference in thickness between the second bump BP2 and the first bump BP1. The thickness difference between the second bump BP2 and the first bump BP1 may be designed in consideration of a thickness of the metal structure MST formed after the bonding.

In an embodiment, the first bump BP1 and the second bump BP2, which may be provided in a single layer, are illustrated, but an embodiment is not limited thereto. At least the second bump BP2 may further include a layer that may generate a thickness difference with the first bump BP1. For example, at least the second bump BP2 may have a multi-layered structure more than the first bump BP1. In other words, the second bump BP2 may include more layers than the first bump BP1. The first bump BP1 and the second bump BP2 may include a single layer or a multilayer common layer, and the second bump BP2 may further include an additional layer in a case that compared to the first bump BP1.

The second bump BP2 may include a first metal layer including a titanium layer or a titanium nitride layer, a second metal layer including gold or copper, and a third metal layer including tin. In the first bump BP1, one or more of the first metal layer, the second metal layer, and the third metal layer may be omitted. The second bump BP2 may include the first metal layer, the second metal layer, and the third metal layer, which may be laminated away from the driving chip DC, but the laminated structure is not limited thereto. In an embodiment, even if the first bump BP1 and the second bump BP2 have the same three-layered structure, the second bump BP2 may include one layer thicker than the first bump BP1.

FIGS. 10A and 10B are schematic cross-sectional views of a first conductive adhesive layer CF1 according to an embodiment, which is taken along line II-II' of FIG. 7. The first conductive adhesive layer CF1 may include a first adhesive layer AL1 in which the conductive balls CB may be mixed and a second adhesive layer AL2 disposed on the first adhesive layer AL1. The conductive balls CB may not be mixed in the second adhesive layer AL2. A slit SLT corresponding to the second area R2 may be defined in one of the first adhesive layer AL1 and the second adhesive layer AL2.

Since the slit SLT may be defined in the first conductive adhesive layer CF1, an amount of adhesive material disposed between the second pad PD2 and the second bump BP2 in the bonding process may be reduced. An interface between the first adhesive layer AL1 and the second adhesive layer AL2, which may be pressed and heated in the bonding process, may be disappeared to form one adhesive layer.

Figure 11A:
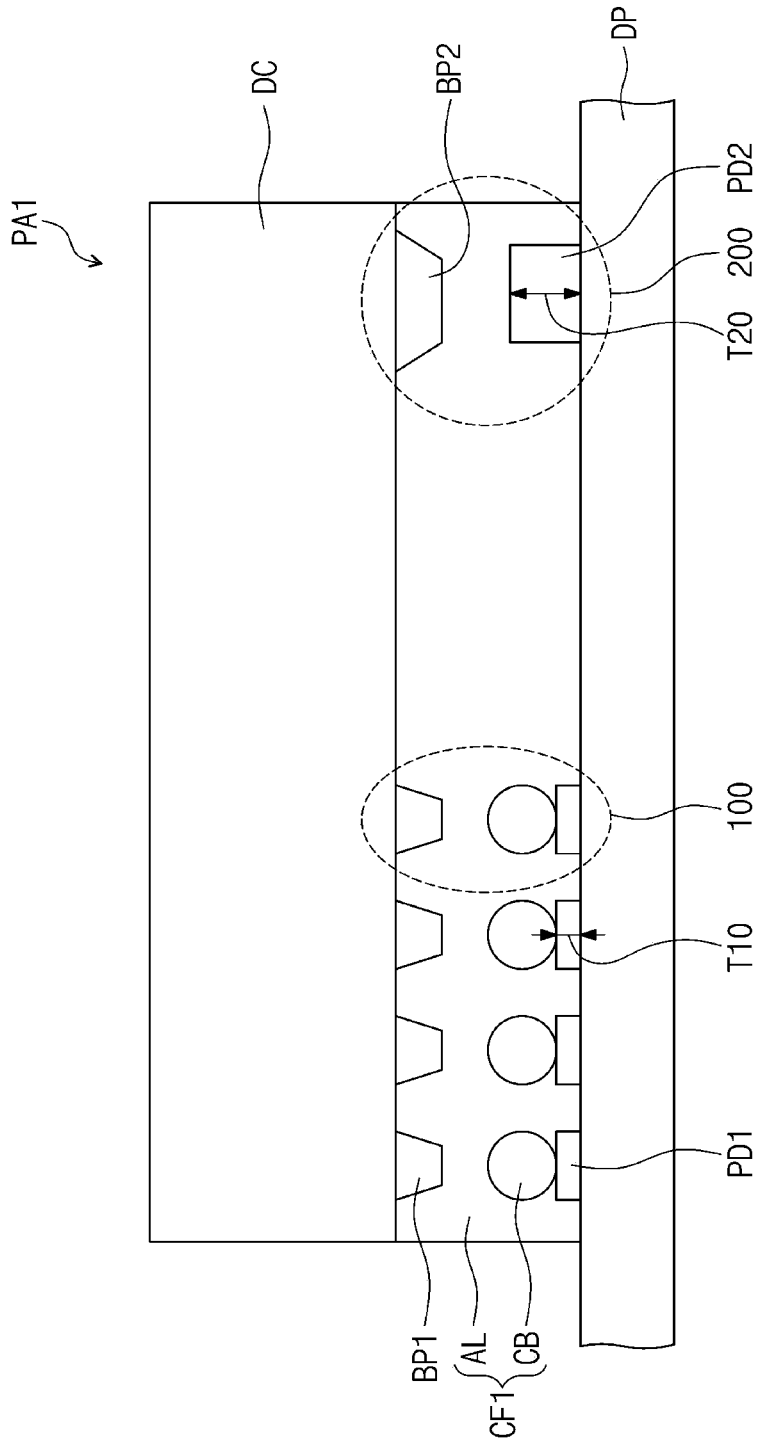
FIG. 11A is a schematic cross-sectional view illustrating the bonding area according to an embodiment.
Figure 11B:
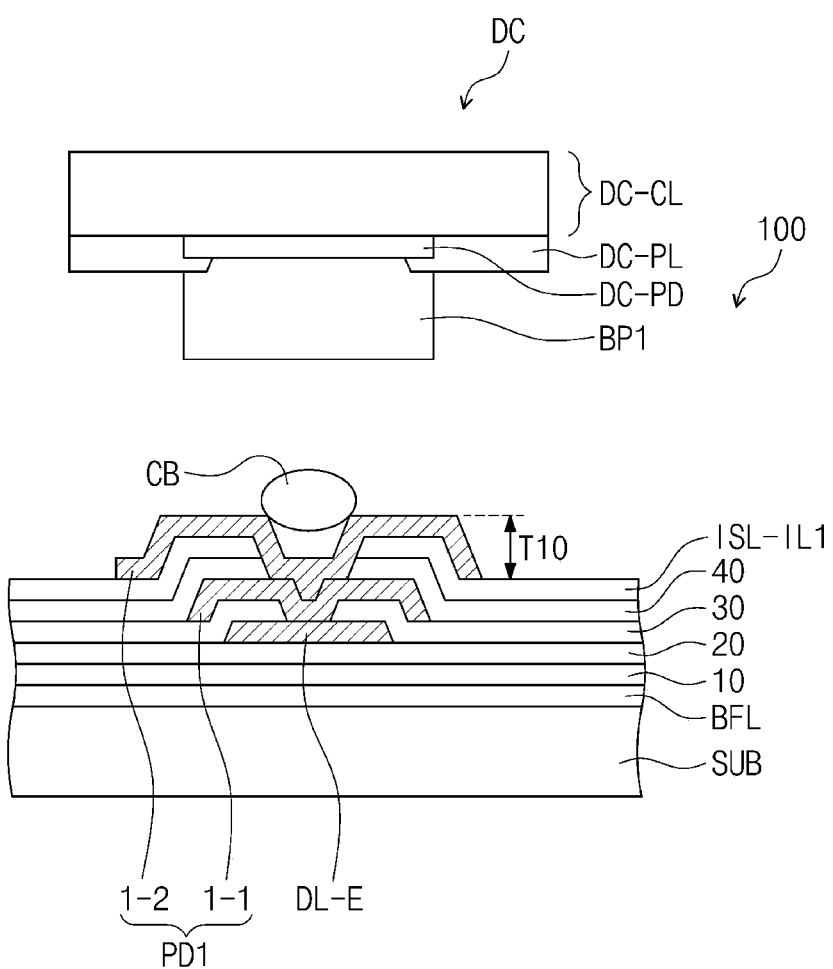
FIG. 11B is an enlarged schematic cross-sectional view illustrating a portion of the bonding area according to an embodiment.
Figure 11C:
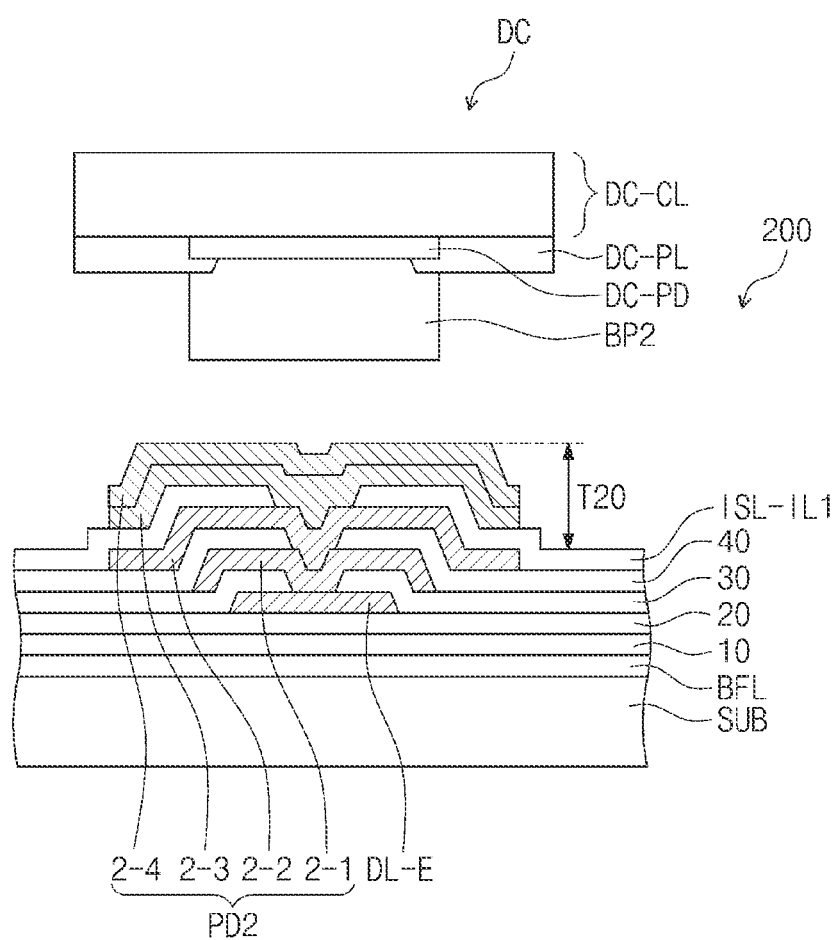
FIG. 11C is an enlarged schematic cross-sectional view illustrating another portion of the bonding area according to an embodiment.

FIG. 11A is a schematic cross-sectional view illustrating the bonding area according to an embodiment. FIG. 11B is an enlarged schematic cross-sectional view illustrating a portion 100 of the bonding area according to an embodiment. FIG. 11C is an enlarged schematic cross-sectional view illustrating the other portion 200 of the bonding area according to an embodiment. FIG. 11B illustrates an enlarged schematic cross-sectional view of the portion 100 of the first area B1. FIG. 11C illustrates an enlarged schematic cross-sectional view of a portion 200 of the second area B2. Hereinafter, detailed descriptions of the elements described with reference to FIGS. 1 to 10B may be omitted.

FIG. 11A illustrates a pre-bonded state before the heating/pressing. According to an embodiment, a thickness T20 of the second pad PD2 may be greater than a thickness T10 of the first pad PD1. The second pad PD2 and the first pad PD1 may have a difference in thickness for the same reason as the reason in which the second bump BP2 and the first bump BP1 may have a difference in thickness, which is described with reference to FIG. 9A.

Referring to FIGS. 11B and 11C, some or a predetermined number of the first to sixth insulating layers 10 to 60 described with reference to FIG. 4 may be disposed in the first pad area PA1. Some or a predetermined number of the first to third input insulating layers ISU-IL1 to ISU-IL3 described with reference to FIG. 5 may be disposed in the first pad area PA1.

The driving chip DC may be a semiconductor chip. The driving chip DC may include a circuit element layer DC-CL, a pad DC-PD electrically connected to the circuit element layer DC-CL, a photo resist layer DC-PL exposing the pad DC-PD, and bumps BP1 and BP2 electrically connected to the pad DC-PD. The circuit element layer DC-CL may have a conductive layer, an insulating layer, and a semiconductor layer, which may be laminated. For convenience of description, the pad DC-PD may be distinguished from the circuit element layer DC-CL, but the pad DC-PD may be a portion of the circuit element layer DC-CL.

Referring to FIG. 11B, the first pad PD1 may include a first layer 1-1 and a second layer 1-2. The first layer 1-1 may be electrically connected to an end DL-E of a corresponding data line through a contact hole passing through the third insulating layer 30. The end DL-E of the data line may be a pad part of the data line. The second layer 1-2 may be electrically connected to the first layer 1-1 through a contact hole passing through the fourth insulating layer 40 and the first input insulating layer ISU-IL1. The first layer 1-1 may be formed by the same process as the first connection electrode CNE1 of FIG. 4 and may include the same laminated structure and the same or similar material as the first connection electrode CNE1 of FIG. 4. The second layer 1-2 may be formed by the same process as the first conductive layer ISU-CL1 of FIG. 5 and may include the same laminated structure and the same or similar material as the first conductive layer ISU-CL1 of FIG. 5.

Referring to FIGS. 11C, the second pad PD2 may include a first layer 2-1, a second layer 2-2, a third layer 2-3, and a fourth layer 2-4. The first layer 2-1 may be electrically connected to an end DL-E of a corresponding data line through a contact hole passing through the third insulating layer 30. The second layer 2-2 may be electrically connected to the corresponding first layer 2-1 through a contact hole passing through the fourth insulating layer 40. The third layer 2-3 may be electrically connected to the second layer 2-2 through a contact hole passing through the first input insulating layer ISU-IL1. The fourth layer 2-4 may be disposed on the third layer 2-3.

The first layer 2-1 may be formed by the same process as the first connection electrode CNE1 of FIG. 4 and may include the same laminated structure and the same or similar material as the first connection electrode CNE1 of FIG. 4. The second layer 2-2 may be formed by the same process as the second connection electrode CNE2 of FIG. 4 and may include the same laminated structure and the same or similar material as the second connection electrode CNE2 of FIG. 4. The third layer 2-3 may be formed by the same process as the first conductive layer ISU-CL1 of FIG. 5 and may include the same laminated structure and the same or similar material as the first conductive layer ISU-CL1 of FIG. 5. The fourth layer 2-4 may be formed by the same process as the second conductive layer ISU-CL2 of FIG. 5 and may include the same laminated structure and the same or similar material. In an embodiment, the fourth layer 2-4 may be omitted. At least one of the third layer 2-3 and the fourth layer 2-4 may have a laminated structure of titanium/aluminum/titanium.

Referring to FIGS. 11B and 11C, the first bump BP1 and the second bump BP2 may have substantially the same thickness. The second pad PD2 may include the number of conductive layers, which may be greater than that of the conductive layers in the first pad PD1 so as to compensate for a height difference corresponding to the conductive ball CB. The laminated structure of the first pad PD1 and the second pad PD2 illustrated in FIGS. 11B and 11C is merely an example and is not limited thereto.

Referring to FIGS. 11B and 11C, an embodiment in which the fifth insulating layer 50 may not be disposed in the first pad area PA1 is illustrated, but is not limited thereto. Also, an embodiment in which the second input insulating layer ISU-IL2 and the third input insulating layer ISU-IL3 may not be disposed in the first pad area PA1 is illustrated, but is not limited thereto.

Figure 12:
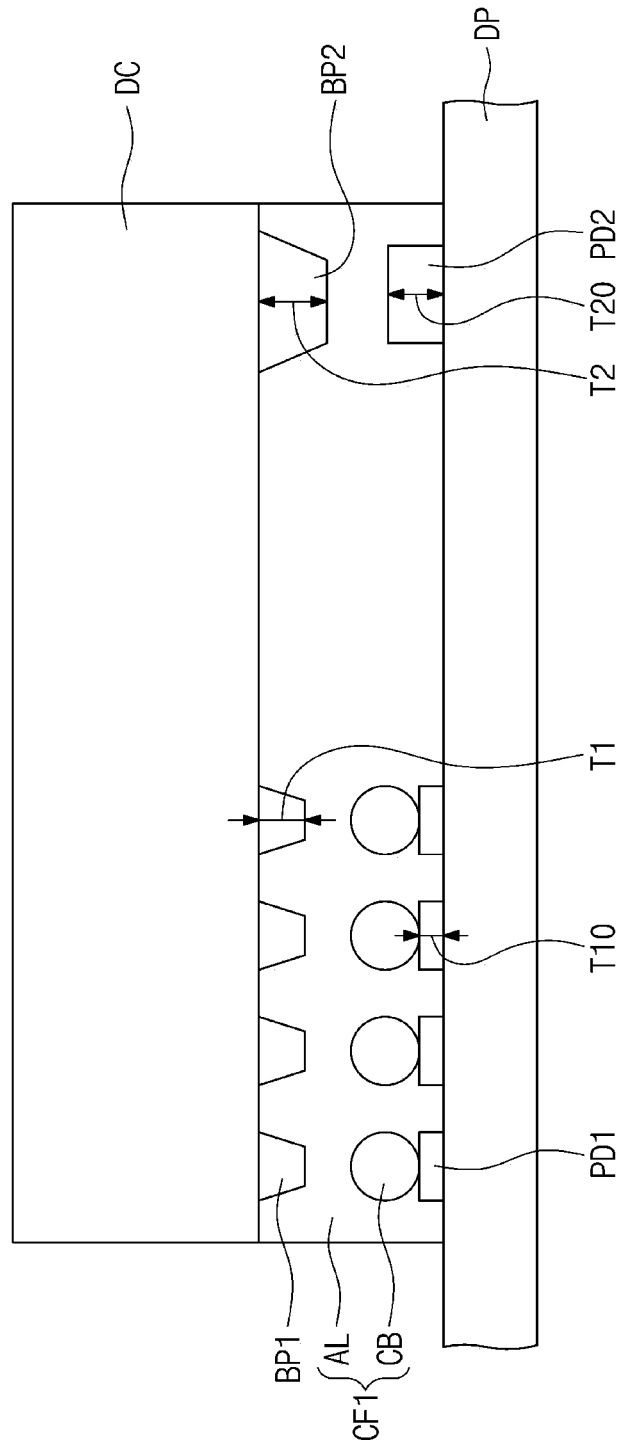
FIG. 12 is a schematic cross-sectional view of the bonding area according to an embodiment.
Figure 13:
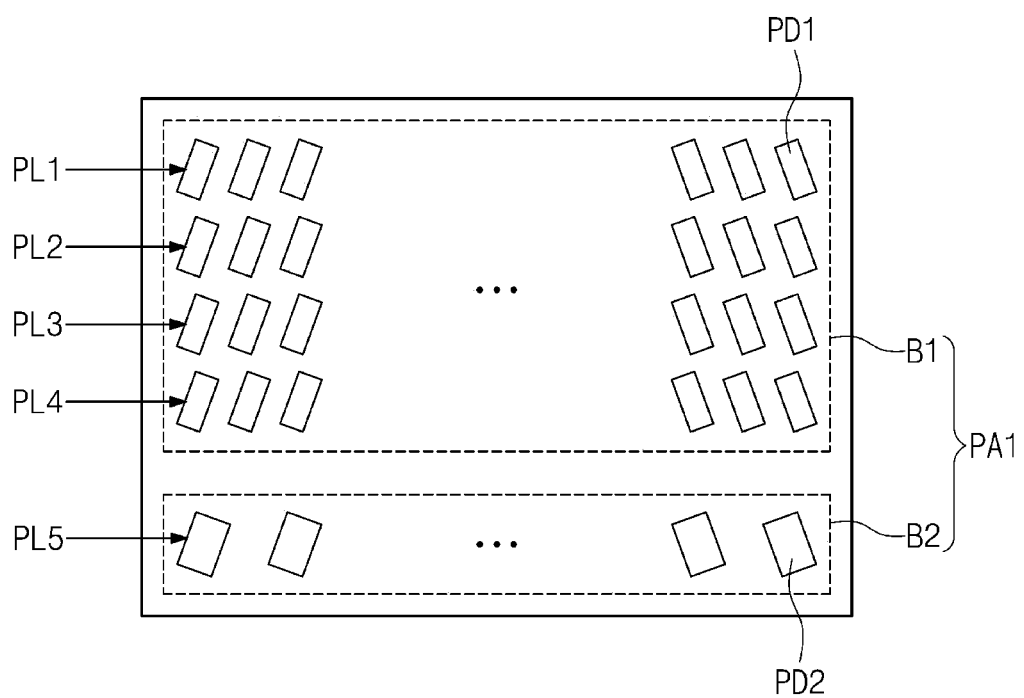
FIG. 13 is a plan view illustrating a first pad area of the display panel according to an embodiment.
Figure 13:
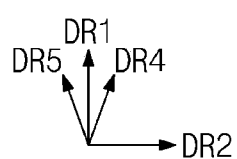

FIG. 12 is a schematic cross-sectional view of the bonding area according to an embodiment. FIG. 13 is a plan view illustrating a first pad area PA1 of the display panel DP according to an embodiment. Hereinafter, a detailed description of the same element as that described with reference to FIGS. 1 to 11C may be omitted.

FIG. 12 illustrates a schematic cross-sectional view corresponding to the schematic cross-sectional view of FIG. 6. Referring to FIG. 12, a thickness T2 of the second bump BP2 may be greater than a thickness T1 of the first bump BP1, and the second pad PD2 may have a multilayered structure more than that of the first pad PD1. A difference in thickness between the second bump BP2 and the first bump BP1 and a difference in number of laminated layers between the second pad PD2 and the first pad PD1 may be adjusted in consideration of a diameter of the conductive ball CB.

FIG. 13 is a schematic plan view corresponding to FIG. 8. Referring to FIG. 13D, at least a portion of the first pads PD1 of the first to fourth pad rows PL1 to PL4 may have a shape extending in a fourth direction DR4 crossing or intersecting the first direction DR1 and the second direction DR2. The other portion of the first pads PD1 of the first to fourth pad rows PL1 to PL4 may have a shape extending in a fifth direction DR5 crossing or intersecting the first direction DR1 and the second direction DR2. The first pads PD1 extending in the fourth direction DR4 and the first pads PD1 extending in the fifth direction DR5 may be symmetrical to each other with respect to the first direction DR1. The second pads PD2 of the fifth pad rows PL5 may have a similar arrangement manner to the first pads PD1 of the first to fourth pad rows PL1 to PL4, and thus the description thereof will be omitted.

According to an embodiment, the two types of pads of the first electronic component may be disposed to be spaced apart from each other. The first pads may be provided more than the second pads and thus may be arranged or disposed more densely. Each of the second bumps corresponding to the second pads of the second electronic component may have an area greater than that of each of the first bumps corresponding to the first pads. In the bonding process of the first electronic component and the second electronic component, the pressure may be applied to the second electronic component. Here, the two kinds of bumps may uniformly distribute the applied pressure.

Each of the first pads may have an area less than that of each of the second pads. The first pads may be electrically connected to the first bumps through the conductive balls, and the second pads may be directly electrically connected to the second bumps through ultrasonic bonding. The different bonding structures may be applied to the pads to suppress the short-circuit defects between the first pads and improve the current characteristics of the electrical bonding between the second pads and the second bumps.

The second bumps may be designed differently from the first bumps, or the second pads may be designed differently from the first pads to solve the limitation in height difference due to the non-arrangement of the conductive balls.

As described above, embodiments are disclosed in the drawings and the specification. While terms are used herein, these terms are not to limit the meaning or the scope of the disclosure described in the claims, but merely used to explain the disclosure. Accordingly, one of ordinary skill in the art will understand from the above that various modifications and other equivalent embodiments are also possible.

What is claimed is:

1. An electronic device comprising:
a first electronic component comprising a first pad area including first pads and second pads spaced apart from the first pads, wherein a number of the first pads is greater than a number of the second pads;
a second electronic component comprising:
first bumps electrically connected to the first pads; and
second bumps electrically connected to the second pads, wherein each of the second bumps has a bonding area greater than a bonding area of each of the first bumps; and
a conductive adhesive layer disposed between the first electronic component and the second electronic component to electrically connect the first pads to the first bumps, wherein
each of the second pads has a thickness greater than a thickness of each of the first pads.

2. The electronic device of claim 1, wherein
the first electronic component comprises a display area adjacent to the first pad area, wherein a pixel is disposed in the display area, and
the second electronic component comprises a driving chip.

3. The electronic device of claim 2, wherein the first electronic component comprises a second pad area comprising third pads electrically connected to the second pads.

4. The electronic device of claim 3, further comprising a circuit board electrically connected to the second pad area.

5. The electronic device of claim 3, wherein
the driving chip receives first signals through the second pads and the second bumps, and
the driving chip provides second signals to the first pads through the first bumps, the second signals being generated based on the first signals.

6. The electronic device of claim 1, wherein
the first pads are disposed in a matrix arrangement comprising a plurality of rows and a plurality of columns, and
the second pads are disposed in a direction parallel to a row direction of the plurality of rows of the matrix arrangement.

7. The electronic device of claim 1, wherein
the first pads define a first pad row, a second pad row, a third pad row, and a fourth pad row disposed in a first direction,
each of the first pad row, the second pad row, the third pad row, and the fourth pad row comprises corresponding pads of the first pads,
the corresponding pads of the first pads are disposed in a second direction intersecting the first direction, and
at least a portion of the corresponding pads of the first pads extends in a direction intersecting the first direction and the second direction in a plan view.

8. The electronic device of claim 1, wherein the conductive adhesive layer comprises:
an adhesive layer; and
a single layer of a plurality of conductive balls included in the adhesive layer.

9. The electronic device of claim 8, wherein
a portion of the plurality of conductive balls is disposed between the first pads and the first bumps, and
none of the conductive balls overlaps the second pads and the second bumps.

10. The electronic device of claim 8, wherein
the conductive adhesive layer comprises a first area and a second area in a plan view,
the plurality of conductive balls are disposed on the first area and the plurality of conductive balls are not disposed on the second area,
the first area of the conductive adhesive layer overlaps the first pads, and
the second area of the conductive adhesive layer overlaps an entirety of the second pads.

11. The electronic device of claim 1, wherein each of the second bumps has a multilayered structure of more layers than layers of each of the first bumps.

12. The electronic device of claim 1, wherein
each of the first pads and the second pads comprises a plurality of laminated conductive layers, and
the second pads comprise a greater number of conductive layers than a number of conductive layers in the first pads.

13. The electronic device of claim 1, wherein
a second pad of the second pads and a second bump of the second bumps constitute a metal structure, the second bump being bonded to the second pad, and
the metal structure comprises a eutectic region of a first metal and a second metal, wherein the first metal is different from the second metal.

14. The electronic device of claim 13, wherein the eutectic region further comprises a third metal different from each of the first metal and the second metal.

15. An electronic device comprising:
a first electronic component comprising a first pad area including first pads and second pads spaced apart from the first pads, wherein a number of first pads is greater than a number of the second pads;
a second electronic component comprising:
first bumps electrically connected to the first pads; and
second bumps electric connected to the second pads, wherein each of the second bumps has a bonding area greater than a bonding area of each of the first bumps; and
a conductive adhesive layer disposed between the first electronic component and the second electronic component to electrically connect the first pads to the first lumps, wherein
each of the second bumps has a thickness greater than a thickness of each of the first bumps.

16. An electronic device comprising:
a display panel comprising a display area and a pad area adjacent to the display area, the pad area comprising first pads and second pads, each of the second pads having a greater surface area than a surface area of each of the first pads;
a driving chip comprising:
first bumps electrically connected to the first pads; and
second bumps electrically connected to the second pads; and
an anisotropic conductive adhesive layer disposed between the display panel and the driving chip to electrically connect the first pads to the first bumps, wherein each of the second pads has a thickness greater than a thickness of each of the first pads.

17. The electronic device of claim 16, wherein
a plurality of pixels are disposed in the display area,
the display panel comprises signal lines that electrically connect the first pads to the plurality of pixels, and
the driving chip provides data signals to the plurality of pixels through the signal lines.

18. The electronic device of claim 16, wherein
the first pads define a plurality of pad rows disposed in a first direction,
each of the plurality of pad rows comprise corresponding pads of the first pads,
the corresponding pads of the first pads are disposed in a second direction intersecting the first direction, and
the second pads define a pad row disposed in the second direction,
wherein an interval between the pad row closest to the pad row of the second pads among the plurality of pad rows of the first pads and the pad row of the second pads is greater than an interval between the plurality of pad rows of the first pads.

19. The electronic device of claim 18, wherein the conductive adhesive layer comprises:
an adhesive layer; and
a single layer of a plurality of conductive balls included in the adhesive layer.

20. The electronic device of claim 19, wherein
the plurality of conductive balls overlap the plurality of pad rows of the first pads, and
none of the plurality of conductive balls are disposed on an area between the pad row of the first pads that is closest to the pad row of the second pads and the pad row of the second pads.

* * * * *